US009899291B2

(12) United States Patent
Kato et al.

(10) Patent No.: US 9,899,291 B2
(45) Date of Patent: Feb. 20, 2018

(54) METHOD FOR PROTECTING LAYER BY FORMING HYDROCARBON-BASED EXTREMELY THIN FILM

(71) Applicant: ASM IP Holding B.V., Almere (NL)

(72) Inventors: Richika Kato, Tokorozawa (JP); Seiji Okuro, Sagamihara (JP); Kunitoshi Namba, Machida (JP); Yuya Nonaka, Kawasaki (JP); Akinori Nakano, Tokyo (JP)

(73) Assignee: ASM IP HOLDING B.V., Almere (NL)

( * ) Notice: Subject to any disclaimer, the term of this patent is extended or adjusted under 35 U.S.C. 154(b) by 94 days.

(21) Appl. No.: 14/798,136

(22) Filed: Jul. 13, 2015

(65) Prior Publication Data
US 2017/0018477 A1   Jan. 19, 2017

(51) Int. Cl.
*H01L 23/31*  (2006.01)
*H01L 21/02*  (2006.01)
*H01L 21/324* (2006.01)

(52) U.S. Cl.
CPC ...... *H01L 23/3192* (2013.01); *H01L 21/0228* (2013.01); *H01L 21/02274* (2013.01); *H01L 21/324* (2013.01)

(58) Field of Classification Search
CPC ............... H01L 23/3192; H01L 21/324; H01L 21/0228; H01L 21/02274
See application file for complete search history.

(56) References Cited

U.S. PATENT DOCUMENTS

| D56,051 S | 8/1920 | Cohn |
|---|---|---|
| 2,161,626 A | 6/1939 | Loughner et al. |
| 2,745,640 A | 5/1956 | Cushman |
| 2,990,045 A | 9/1959 | Root |
| 3,089,507 A | 5/1963 | Drake et al. |
| 3,094,396 A | 6/1963 | Sylvester et al. |
| 3,232,437 A | 2/1966 | Hultgren |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |

(Continued)

FOREIGN PATENT DOCUMENTS

| CN | 1563483 | 1/2005 |
|---|---|---|
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — John P Dulka
(74) *Attorney, Agent, or Firm* — Snell & Wilmer LLP

(57) ABSTRACT

A method for protecting a layer includes: providing a substrate having a target layer and forming a protective layer on the target layer, said protective layer contacting and covering the target layer and containing a hydrocarbon-based layer constituting at least an upper part of the protective layer, which hydrocarbon-based layer is formed by plasma-enhanced atomic layer deposition (PEALD) using an alkylaminosilane precursor and a noble gas without a reactant.

16 Claims, 8 Drawing Sheets

(56) References Cited

U.S. PATENT DOCUMENTS

| | | |
|---|---|---|
| 4,054,071 A | 10/1977 | Patejak |
| 4,058,430 A | 11/1977 | Suntola et al. |
| 4,134,425 A | 1/1979 | Gussefeld et al. |
| 4,145,699 A | 3/1979 | Hu et al. |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |
| 4,401,507 A | 8/1983 | Engle |
| 4,414,492 A | 11/1983 | Hanlet |
| 4,436,674 A | 3/1984 | McMenamin |
| 4,479,831 A | 10/1984 | Sandow |
| 4,499,354 A | 2/1985 | Hill et al. |
| 4,512,113 A | 4/1985 | Budinger |
| 4,570,328 A | 2/1986 | Price et al. |
| 4,579,623 A | 4/1986 | Suzuki et al. |
| D288,556 S | 3/1987 | Wallgren |
| 4,653,541 A | 3/1987 | Oehlschlaeger et al. |
| 4,654,226 A | 3/1987 | Jackson et al. |
| 4,681,134 A | 7/1987 | Paris |
| 4,718,637 A | 1/1988 | Contin |
| 4,722,298 A | 2/1988 | Rubin et al. |
| 4,735,259 A | 4/1988 | Vincent |
| 4,753,192 A | 6/1988 | Goldsmith et al. |
| 4,756,794 A | 7/1988 | Yoder |
| 4,780,169 A | 10/1988 | Stark et al. |
| 4,789,294 A | 12/1988 | Sato et al. |
| 4,821,674 A | 4/1989 | deBoer et al. |
| 4,827,430 A | 5/1989 | Aid et al. |
| 4,837,185 A | 6/1989 | Yau et al. |
| 4,854,263 A | 8/1989 | Chang et al. |
| 4,857,137 A | 8/1989 | Tashiro et al. |
| 4,857,382 A | 8/1989 | Sheng et al. |
| 4,882,199 A | 11/1989 | Sadoway et al. |
| 4,976,996 A | 12/1990 | Monkowski et al. |
| 4,978,567 A | 12/1990 | Miller |
| 4,984,904 A | 1/1991 | Nakano et al. |
| 4,985,114 A | 1/1991 | Okudaira |
| 4,986,215 A | 1/1991 | Yamada |
| 4,987,856 A | 1/1991 | Hey |
| 4,991,614 A | 2/1991 | Hammel |
| 5,013,691 A | 5/1991 | Lory et al. |
| 5,027,746 A | 7/1991 | Frijlink |
| 5,028,366 A | 7/1991 | Harakal et al. |
| 5,060,322 A | 10/1991 | Delepine |
| 5,062,386 A | 11/1991 | Christensen |
| 5,065,698 A | 11/1991 | Koike |
| 5,074,017 A | 12/1991 | Toya et al. |
| 5,098,638 A | 3/1992 | Sawada |
| 5,104,514 A | 4/1992 | Quartarone |
| 5,116,018 A | 5/1992 | Friemoth et al. |
| D327,534 S | 6/1992 | Manville |
| 5,119,760 A | 6/1992 | McMillan et al. |
| 5,167,716 A | 12/1992 | Boitnott et al. |
| 5,178,682 A | 1/1993 | Tsukamoto et al. |
| 5,183,511 A | 2/1993 | Yamazaki et al. |
| 5,192,717 A | 3/1993 | Kawakami |
| 5,194,401 A | 3/1993 | Adams et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,246,500 A | 9/1993 | Samata et al. |
| 5,271,967 A | 12/1993 | Kramer et al. |
| 5,288,684 A | 2/1994 | Yamazaki et al. |
| 5,306,946 A | 4/1994 | Yamamoto |
| 5,315,092 A | 5/1994 | Takahashi et al. |
| 5,326,427 A | 7/1994 | Jerbic |
| 5,336,327 A | 8/1994 | Lee |
| 5,354,580 A | 10/1994 | Goela et al. |
| 5,356,478 A | 10/1994 | Chen et al. |
| 5,360,269 A | 11/1994 | Ogawa et al. |
| 5,380,367 A | 1/1995 | Bertone |
| 5,382,311 A | 1/1995 | Ishikawa et al. |
| 5,404,082 A | 4/1995 | Hernandez et al. |
| 5,413,813 A | 5/1995 | Cruse et al. |
| 5,415,753 A | 5/1995 | Hurwitt et al. |
| 5,421,893 A | 6/1995 | Perlov |
| 5,422,139 A | 6/1995 | Fischer |
| 5,430,011 A | 7/1995 | Tanaka et al. |
| 5,494,494 A | 2/1996 | Mizuno et al. |
| 5,496,408 A | 3/1996 | Motoda et al. |
| 5,504,042 A | 4/1996 | Cho et al. |
| 5,518,549 A | 5/1996 | Hellwig |
| 5,527,417 A | 6/1996 | Iida et al. |
| 5,531,835 A | 7/1996 | Fodor et al. |
| 5,574,247 A | 11/1996 | Nishitani et al. |
| 5,577,331 A | 11/1996 | Suzuki |
| 5,589,002 A | 12/1996 | Su |
| 5,589,110 A | 12/1996 | Motoda et al. |
| 5,595,606 A | 1/1997 | Fujikawa et al. |
| 5,601,641 A | 2/1997 | Stephens |
| 5,604,410 A | 2/1997 | Vollkommer et al. |
| 5,616,947 A | 4/1997 | Tamura |
| 5,621,982 A | 4/1997 | Yamashita |
| 5,632,919 A | 5/1997 | MacCracken et al. |
| D380,527 S | 7/1997 | Velez |
| 5,679,215 A | 10/1997 | Barnes et al. |
| 5,681,779 A | 10/1997 | Pasch et al. |
| 5,683,517 A | 11/1997 | Shan |
| 5,695,567 A | 12/1997 | Kordina |
| 5,718,574 A | 2/1998 | Shimazu |
| 5,724,748 A | 3/1998 | Brooks |
| 5,728,223 A | 3/1998 | Murakarni et al. |
| 5,730,801 A | 3/1998 | Tepman et al. |
| 5,732,744 A | 3/1998 | Barr et al. |
| 5,736,314 A | 4/1998 | Hayes et al. |
| 5,777,838 A | 7/1998 | Tamagawa et al. |
| 5,781,693 A | 7/1998 | Balance et al. |
| 5,796,074 A | 8/1998 | Edelstein et al. |
| 5,801,104 A | 9/1998 | Schuegraf et al. |
| 5,819,434 A | 10/1998 | Herchen et al. |
| 5,827,757 A | 10/1998 | Robinson, Jr. et al. |
| 5,836,483 A | 11/1998 | Disel |
| 5,837,320 A | 11/1998 | Hampden-Smith et al. |
| 5,852,879 A | 12/1998 | Schumaier |
| 5,853,484 A | 12/1998 | Jeong |
| 5,855,680 A | 1/1999 | Soininen et al. |
| 5,855,681 A | 1/1999 | Maydan et al. |
| 5,873,942 A | 2/1999 | Park |
| 5,877,095 A | 3/1999 | Tamura et al. |
| D409,894 S | 5/1999 | McClurg |
| 5,908,672 A | 6/1999 | Ryu |
| 5,916,365 A | 6/1999 | Sherman |
| 5,920,798 A | 7/1999 | Higuchi et al. |
| 5,968,275 A | 10/1999 | Lee et al. |
| 5,975,492 A | 11/1999 | Brenes |
| 5,979,506 A | 11/1999 | Aarseth |
| 5,997,588 A | 12/1999 | Goodwin |
| 5,997,768 A | 12/1999 | Scully |
| D419,652 S | 1/2000 | Hall et al. |
| 6,013,553 A | 1/2000 | Wallace |
| 6,015,465 A | 1/2000 | Kholodenko et al. |
| 6,017,779 A | 1/2000 | Miyasaka |
| 6,024,799 A | 2/2000 | Chen |
| 6,035,101 A | 3/2000 | Sajoto et al. |
| 6,042,652 A | 3/2000 | Hyun |
| 6,044,860 A | 4/2000 | Nue |
| 6,050,506 A | 4/2000 | Guo et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,099,302 A | 8/2000 | Hong et al. |
| 6,122,036 A | 9/2000 | Yamasaki et al. |
| 6,124,600 A | 9/2000 | Moroishi et al. |
| 6,125,789 A | 10/2000 | Gupta et al. |
| 6,129,044 A | 10/2000 | Zhao et al. |
| 6,134,807 A | 10/2000 | Komino |
| 6,137,240 A | 10/2000 | Bogdan et al. |
| 6,140,252 A | 10/2000 | Cho et al. |
| 6,148,761 A | 11/2000 | Majewski et al. |

(56) References Cited

U.S. PATENT DOCUMENTS

| | | | |
|---|---|---|---|
| 6,160,244 A | 12/2000 | Ohashi | |
| 6,161,500 A | 12/2000 | Kopacz et al. | |
| 6,162,323 A | 12/2000 | Koshimizu et al. | |
| 6,180,979 B1 | 1/2001 | Hofman et al. | |
| 6,187,691 B1 | 2/2001 | Fukuda | |
| 6,190,634 B1 | 2/2001 | Lieber et al. | |
| 6,194,037 B1 | 2/2001 | Terasaki et al. | |
| 6,201,999 B1 | 3/2001 | Jevtic | |
| 6,207,932 B1 | 3/2001 | Yoo | |
| 6,212,789 B1 | 4/2001 | Kato | |
| 6,218,288 B1 | 4/2001 | Li et al. | |
| 6,250,250 B1 | 6/2001 | Maishev et al. | |
| 6,271,148 B1 | 8/2001 | Kao | |
| 6,274,878 B1 | 8/2001 | Li et al. | |
| 6,281,098 B1 | 8/2001 | Wang | |
| 6,287,965 B1 | 9/2001 | Kang et al. | |
| D449,873 S | 10/2001 | Bronson | |
| 6,296,909 B1 | 10/2001 | Spitsberg | |
| 6,299,133 B2 | 10/2001 | Waragai et al. | |
| 6,302,964 B1 | 10/2001 | Umotoy et al. | |
| 6,303,523 B2 | 10/2001 | Cheung | |
| 6,305,898 B1 | 10/2001 | Yamagishi et al. | |
| 6,312,525 B1 | 11/2001 | Bright et al. | |
| 6,315,512 B1 | 11/2001 | Tabrizi et al. | |
| D451,893 S | 12/2001 | Robson | |
| D452,220 S | 12/2001 | Robson | |
| 6,325,858 B1 | 12/2001 | Wengert | |
| 6,326,597 B1 | 12/2001 | Lubomirsky et al. | |
| 6,329,297 B1 | 12/2001 | Balish | |
| 6,342,427 B1 | 1/2002 | Choi et al. | |
| 6,347,636 B1 | 2/2002 | Xia | |
| 6,352,945 B1 | 3/2002 | Matsuki | |
| 6,367,410 B1 | 4/2002 | Leahey et al. | |
| 6,368,987 B1 | 4/2002 | Kopacz et al. | |
| 6,370,796 B1 | 4/2002 | Zucker | |
| 6,372,583 B1 | 4/2002 | Tyagi | |
| 6,374,831 B1 | 4/2002 | Chandran | |
| 6,375,312 B1 | 4/2002 | Ikeda et al. | |
| D457,609 S | 5/2002 | Piano | |
| 6,383,566 B1 | 5/2002 | Zagdoun | |
| 6,383,955 B1 | 5/2002 | Matsuki | |
| 6,387,207 B1 | 5/2002 | Janakiraman | |
| 6,391,803 B1 | 5/2002 | Kim et al. | |
| 6,398,184 B1 | 6/2002 | Sowada et al. | |
| 6,410,459 B2 | 6/2002 | Blalock et al. | |
| 6,413,321 B1 | 7/2002 | Kim et al. | |
| 6,413,583 B1 | 7/2002 | Moghadam et al. | |
| 6,420,279 B1 | 7/2002 | Ono et al. | |
| D461,233 S | 8/2002 | Whalen | |
| D461,882 S | 8/2002 | Piano | |
| 6,435,798 B1 | 8/2002 | Satoh | |
| 6,436,819 B1 | 8/2002 | Zhang | |
| 6,437,444 B2 | 8/2002 | Andideh | |
| 6,445,574 B1 | 9/2002 | Saw et al. | |
| 6,446,573 B2 | 9/2002 | Hirayama et al. | |
| 6,450,757 B1 | 9/2002 | Saeki | |
| 6,454,860 B2 | 9/2002 | Metzner et al. | |
| 6,455,445 B2 | 9/2002 | Matsuki | |
| 6,461,435 B1 | 10/2002 | Littau et al. | |
| 6,468,924 B2 | 10/2002 | Lee | |
| 6,472,266 B1 | 10/2002 | Yu et al. | |
| 6,475,276 B1 | 11/2002 | Elers et al. | |
| 6,475,930 B1 | 11/2002 | Junker et al. | |
| 6,478,872 B1 | 11/2002 | Chae et al. | |
| 6,482,331 B2 | 11/2002 | Lu et al. | |
| 6,482,663 B1 | 11/2002 | Buckland | |
| 6,483,989 B1 | 11/2002 | Okada et al. | |
| 6,494,065 B2 | 12/2002 | Babbitt | |
| 6,499,533 B2 | 12/2002 | Yamada | |
| 6,503,562 B1 | 1/2003 | Saito et al. | |
| 6,503,826 B1 | 1/2003 | Oda | |
| 6,511,539 B1 | 1/2003 | Raaijmakers | |
| 6,521,295 B1 | 2/2003 | Remington | |
| 6,521,547 B1 | 2/2003 | Chang et al. | |
| 6,528,430 B2 | 3/2003 | Kwan | |
| 6,528,767 B2 | 3/2003 | Bagley et al. | |
| 6,531,193 B2 | 3/2003 | Fonash et al. | |
| 6,531,412 B2 | 3/2003 | Conti et al. | |
| 6,534,395 B2 | 3/2003 | Werkhoven et al. | |
| 6,558,755 B2 | 5/2003 | Berry et al. | |
| 6,569,239 B2 | 5/2003 | Arai et al. | |
| 6,573,030 B1 | 6/2003 | Fairbairn et al. | |
| 6,576,062 B2 | 6/2003 | Matsuse | |
| 6,576,064 B2 | 6/2003 | Griffiths et al. | |
| 6,576,300 B1 | 6/2003 | Berry et al. | |
| 6,579,833 B1 | 6/2003 | McNallan et al. | |
| 6,583,048 B1 | 6/2003 | Vincent et al. | |
| 6,590,251 B2 | 7/2003 | Kang et al. | |
| 6,594,550 B1 | 7/2003 | Okrah | |
| 6,598,559 B1 | 7/2003 | Vellore et al. | |
| 6,627,503 B2 | 9/2003 | Ma et al. | |
| 6,632,478 B2 | 10/2003 | Gaillard et al. | |
| 6,633,364 B2 | 10/2003 | Hayashi | |
| 6,635,117 B1 | 10/2003 | Kinnard et al. | |
| 6,638,839 B2 | 10/2003 | Deng et al. | |
| 6,645,304 B2 | 11/2003 | Yamaguchi | |
| 6,648,974 B1 | 11/2003 | Ogliari et al. | |
| 6,649,921 B1 | 11/2003 | Cekic et al. | |
| 6,652,924 B2 | 11/2003 | Sherman | |
| 6,673,196 B1 | 1/2004 | Oyabu | |
| 6,682,973 B1 | 1/2004 | Paton et al. | |
| D486,891 S | 2/2004 | Cronce | |
| 6,688,784 B1 | 2/2004 | Templeton | |
| 6,689,220 B1 | 2/2004 | Nguyen | |
| 6,692,575 B1 | 2/2004 | Omstead et al. | |
| 6,692,576 B2 | 2/2004 | Halpin et al. | |
| 6,699,003 B2 | 3/2004 | Saeki | |
| 6,709,989 B2 | 3/2004 | Ramdani et al. | |
| 6,710,364 B2 | 3/2004 | Guldi et al. | |
| 6,713,824 B1 | 3/2004 | Mikata | |
| 6,716,571 B2 | 4/2004 | Gabriel | |
| 6,723,642 B1 | 4/2004 | Lim et al. | |
| 6,730,614 B1 | 5/2004 | Lim et al. | |
| 6,734,090 B2 | 5/2004 | Agarwala et al. | |
| 6,740,853 B1 | 5/2004 | Kitayama et al. | |
| 6,743,475 B2 | 6/2004 | Skarp et al. | |
| 6,743,738 B2 | 6/2004 | Todd et al. | |
| 6,753,507 B2 | 6/2004 | Fure et al. | |
| 6,756,318 B2 | 6/2004 | Nguyen et al. | |
| 6,759,098 B2 | 7/2004 | Han | |
| 6,760,981 B2 | 7/2004 | Leap | |
| 6,784,108 B1 | 8/2004 | Donohoe et al. | |
| D497,977 S | 11/2004 | Engelbrektsson | |
| 6,815,350 B2 | 11/2004 | Kim et al. | |
| 6,820,570 B2 | 11/2004 | Kilpela et al. | |
| 6,821,910 B2 | 11/2004 | Adomaitis et al. | |
| 6,824,665 B2 | 11/2004 | Shelnut et al. | |
| 6,825,134 B2 | 11/2004 | Law et al. | |
| 6,846,515 B2 | 1/2005 | Vrtis | |
| 6,847,014 B1 | 1/2005 | Benjamin et al. | |
| 6,858,524 B2 | 2/2005 | Haukka et al. | |
| 6,858,547 B2 | 2/2005 | Metzner | |
| 6,863,019 B2 | 3/2005 | Shamouilian | |
| 6,864,041 B2 | 3/2005 | Brown | |
| 6,872,258 B2 | 3/2005 | Park et al. | |
| 6,872,259 B2 | 3/2005 | Strang | |
| 6,874,247 B1 | 4/2005 | Hsu | |
| 6,874,480 B1 | 4/2005 | Ismailov | |
| 6,875,677 B1 | 4/2005 | Conley, Jr. et al. | |
| 6,876,017 B2 | 4/2005 | Goodner | |
| 6,884,066 B2 | 4/2005 | Nguyen et al. | |
| 6,884,319 B2 | 4/2005 | Kim | |
| 6,889,864 B2 | 5/2005 | Lindfors et al. | |
| 6,895,158 B2 | 5/2005 | Alyward et al. | |
| 6,899,507 B2 | 5/2005 | Yamagishi et al. | |
| 6,909,839 B2 | 6/2005 | Wang et al. | |
| 6,911,092 B2 | 6/2005 | Sneh | |
| 6,913,796 B2 | 7/2005 | Albano et al. | |
| 6,930,059 B2 | 8/2005 | Conley, Jr. et al. | |
| 6,935,269 B2 | 8/2005 | Lee et al. | |
| 6,939,817 B2 | 9/2005 | Sandhu et al. | |
| 6,951,587 B1 | 10/2005 | Narushima | |
| 6,953,609 B2 | 10/2005 | Carollo | |
| 6,955,836 B2 | 10/2005 | Kumagai et al. | |

(56) References Cited

U.S. PATENT DOCUMENTS

| | | |
|---|---|---|
| 6,972,478 B1 | 12/2005 | Waite et al. |
| 6,974,781 B2 | 12/2005 | Timmermans et al. |
| 6,976,822 B2 | 12/2005 | Woodruff |
| 6,984,595 B1 | 1/2006 | Yamazaki |
| 6,990,430 B2 | 1/2006 | Hosek |
| 7,021,881 B2 | 4/2006 | Yamagishi |
| 7,045,430 B2 | 5/2006 | Ahn et al. |
| 7,049,247 B2 | 5/2006 | Gates et al. |
| 7,053,009 B2 | 5/2006 | Conley, Jr. et al. |
| 7,055,875 B2 | 6/2006 | Bonora |
| 7,071,051 B1 | 7/2006 | Jeon et al. |
| 7,084,079 B2 | 8/2006 | Conti et al. |
| 7,088,003 B2 | 8/2006 | Gates et al. |
| 7,092,287 B2 | 8/2006 | Beulens et al. |
| 7,098,149 B2 | 8/2006 | Lukas |
| 7,109,098 B1 | 9/2006 | Ramaswamy et al. |
| 7,115,838 B2 | 10/2006 | Kurara et al. |
| 7,122,085 B2 | 10/2006 | Shero et al. |
| 7,122,222 B2 | 10/2006 | Xiao et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,143,897 B1 | 12/2006 | Guzman et al. |
| 7,147,766 B2 | 12/2006 | Uzoh et al. |
| 7,153,542 B2 | 12/2006 | Nguyen et al. |
| 7,163,721 B2 | 1/2007 | Zhang et al. |
| 7,163,900 B2 | 1/2007 | Weber |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,201,943 B2 | 4/2007 | Park et al. |
| 7,204,887 B2 | 4/2007 | Kawamura et al. |
| 7,205,246 B2 | 4/2007 | MacNeil et al. |
| 7,205,247 B2 | 4/2007 | Lee et al. |
| 7,207,763 B2 | 4/2007 | Lee |
| 7,208,389 B1 | 4/2007 | Tipton et al. |
| 7,211,524 B2 | 5/2007 | Ryu et al. |
| 7,234,476 B2 | 6/2007 | Arai |
| 7,235,137 B2 | 6/2007 | Kitayama et al. |
| 7,235,482 B2 | 6/2007 | Wu |
| 7,235,501 B2 | 6/2007 | Ahn et al. |
| 7,238,596 B2 | 7/2007 | Kouvetakis et al. |
| 7,265,061 B1 | 9/2007 | Cho et al. |
| D553,104 S | 10/2007 | Oohashi et al. |
| 7,290,813 B2 | 11/2007 | Bonora |
| 7,294,581 B2 | 11/2007 | Haverkort et al. |
| 7,297,641 B2 | 11/2007 | Todd et al. |
| 7,298,009 B2 | 11/2007 | Yan et al. |
| D557,226 S | 12/2007 | Uchino et al. |
| 7,307,178 B2 | 12/2007 | Kiyomori et al. |
| 7,312,148 B2 | 12/2007 | Ramaswamy et al. |
| 7,312,162 B2 | 12/2007 | Ramaswamy et al. |
| 7,312,494 B2 | 12/2007 | Ahn et al. |
| 7,323,401 B2 | 1/2008 | Ramaswamy et al. |
| 7,326,657 B2 | 2/2008 | Xia et al. |
| 7,327,948 B1 | 2/2008 | Shrinivasan |
| 7,329,947 B2 | 2/2008 | Adachi et al. |
| 7,335,611 B2 | 2/2008 | Ramaswamy et al. |
| 7,354,847 B2 | 4/2008 | Chan et al. |
| 7,357,138 B2 | 4/2008 | Ji et al. |
| 7,381,644 B1 | 6/2008 | Soubramonium et al. |
| 7,393,418 B2 | 7/2008 | Yokogawa |
| 7,393,736 B2 | 7/2008 | Ahn et al. |
| 7,393,765 B2 | 7/2008 | Hanawa et al. |
| 7,396,491 B2 | 7/2008 | Marking et al. |
| 7,399,388 B2 | 7/2008 | Moghadam et al. |
| 7,402,534 B2 | 7/2008 | Mahajani |
| 7,405,166 B2 | 7/2008 | Liang et al. |
| 7,405,454 B2 | 7/2008 | Ahn et al. |
| D575,713 S | 8/2008 | Ratcliffe |
| 7,411,352 B2 | 8/2008 | Madocks |
| 7,414,281 B1 | 8/2008 | Fastow |
| 7,416,989 B1 | 8/2008 | Liu et al. |
| 7,422,653 B2 | 9/2008 | Blahnik et al. |
| 7,422,775 B2 | 9/2008 | Ramaswamy et al. |
| 7,429,532 B2 | 9/2008 | Ramaswamy et al. |
| 7,431,966 B2 | 10/2008 | Derderian et al. |
| 7,437,060 B2 | 10/2008 | Wang et al. |
| 7,442,275 B2 | 10/2008 | Cowans |
| 7,476,291 B2 | 1/2009 | Wang et al. |
| 7,479,198 B2 | 1/2009 | Guffrey |
| D585,968 S | 2/2009 | Elkins et al. |
| 7,489,389 B2 | 2/2009 | Shibazaki et al. |
| 7,494,882 B2 | 2/2009 | Vitale |
| 7,498,242 B2 | 3/2009 | Kumar et al. |
| 7,501,292 B2 | 3/2009 | Matsushita et al. |
| 7,503,980 B2 | 3/2009 | Kida et al. |
| D590,933 S | 4/2009 | Vansell |
| 7,514,375 B1 | 4/2009 | Shanker et al. |
| 7,541,297 B2 | 4/2009 | Mallick et al. |
| D593,969 S | 6/2009 | Li |
| 7,547,363 B2 | 6/2009 | Tomiyasu et al. |
| 7,550,396 B2 | 6/2009 | Frohberg et al. |
| 7,566,891 B2 | 7/2009 | Rocha-Alvarez et al. |
| 7,575,968 B2 | 8/2009 | Sadaka et al. |
| 7,579,785 B2 | 8/2009 | DeVincentis et al. |
| 7,582,555 B1 | 9/2009 | Lang |
| 7,589,003 B2 | 9/2009 | Kouvetakis et al. |
| 7,589,029 B2 | 9/2009 | Derderian et al. |
| D602,575 S | 10/2009 | Breda |
| 7,598,513 B2 | 10/2009 | Kouvetakis et al. |
| 7,601,223 B2 | 10/2009 | Lindfors et al. |
| 7,601,225 B2 | 10/2009 | Tuominen et al. |
| 7,611,751 B2 | 11/2009 | Elers |
| 7,611,980 B2 | 11/2009 | Wells et al. |
| 7,618,226 B2 | 11/2009 | Takizawa |
| D606,952 S | 12/2009 | Lee |
| 7,629,277 B2 | 12/2009 | Ghatnagar |
| 7,632,549 B2 | 12/2009 | Goundar |
| 7,640,142 B2 | 12/2009 | Tachikawa et al. |
| 7,651,583 B2 | 1/2010 | Kent et al. |
| 7,651,961 B2 | 1/2010 | Clark |
| D609,652 S | 2/2010 | Nagasaka |
| D609,655 S | 2/2010 | Sugimoto |
| 7,678,197 B2 | 3/2010 | Maki |
| 7,678,715 B2 | 3/2010 | Mungekar et al. |
| 7,682,657 B2 | 3/2010 | Sherman |
| D613,829 S | 4/2010 | Griffin et al. |
| D614,153 S | 4/2010 | Fondurulia et al. |
| D614,267 S | 4/2010 | Breda |
| D614,268 S | 4/2010 | Breda |
| D614,593 S | 4/2010 | Lee |
| 7,690,881 B2 | 4/2010 | Yamagishi |
| 7,691,205 B2 | 4/2010 | Ikedo |
| 7,713,874 B2 | 5/2010 | Milligan |
| 7,720,560 B2 | 5/2010 | Menser et al. |
| 7,723,648 B2 | 5/2010 | Tsukamoto et al. |
| 7,727,864 B2 | 6/2010 | Elers |
| 7,732,343 B2 | 6/2010 | Niroomand et al. |
| 7,740,705 B2 | 6/2010 | Li |
| 7,745,346 B2 | 6/2010 | Hausmann et al. |
| 7,748,760 B2 | 7/2010 | Kushida |
| 7,754,621 B2 | 7/2010 | Putjkonen |
| 7,763,869 B2 | 7/2010 | Matsushita et al. |
| 7,767,262 B2 | 8/2010 | Clark |
| 7,771,796 B2 | 8/2010 | Kohno et al. |
| 7,780,440 B2 | 8/2010 | Shibagaki et al. |
| 7,789,965 B2 | 9/2010 | Matsushita et al. |
| 7,790,633 B1 | 9/2010 | Tarafdar et al. |
| 7,803,722 B2 | 9/2010 | Liang |
| 7,807,578 B2 | 10/2010 | Bencher et al. |
| 7,816,278 B2 | 10/2010 | Reed et al. |
| 7,824,492 B2 | 11/2010 | Tois et al. |
| 7,825,040 B1 | 11/2010 | Fukazawa et al. |
| 7,833,353 B2 | 11/2010 | Furukawahara et al. |
| 7,838,084 B2 | 11/2010 | Derderian et al. |
| 7,842,518 B2 | 11/2010 | Miyajima |
| 7,842,622 B1 | 11/2010 | Lee et al. |
| D629,874 S | 12/2010 | Hermans |
| 7,851,019 B2 | 12/2010 | Tuominen et al. |
| 7,851,232 B2 | 12/2010 | van Schravendijk et al. |
| 7,865,070 B2 | 1/2011 | Nakamura |
| 7,884,918 B2 | 2/2011 | Hattori |

(56) References Cited

U.S. PATENT DOCUMENTS

| | | |
|---|---|---|
| 7,888,233 B1 | 2/2011 | Gauri |
| D634,719 S | 3/2011 | Yasuda et al. |
| 7,897,215 B1 | 3/2011 | Fair et al. |
| 7,902,582 B2 | 3/2011 | Forbes et al. |
| 7,910,288 B2 | 3/2011 | Abatchev et al. |
| 7,915,139 B1 | 3/2011 | Lang |
| 7,919,416 B2 | 4/2011 | Lee et al. |
| 7,925,378 B2 | 4/2011 | Gilchrist et al. |
| 7,935,940 B1 | 5/2011 | Smargiassi |
| 7,939,447 B2 | 5/2011 | Bauer et al. |
| 7,955,516 B2 | 6/2011 | Madhavi |
| 7,963,736 B2 | 6/2011 | Takizawa et al. |
| 7,972,980 B2 | 7/2011 | Lee et al. |
| 7,981,751 B2 | 7/2011 | Zhu et al. |
| D643,055 S | 8/2011 | Takahashi |
| 7,992,318 B2 | 8/2011 | Kawaji |
| 7,994,721 B2 | 8/2011 | Espiau et al. |
| 7,998,875 B2 | 8/2011 | DeYoung |
| 8,003,174 B2 | 8/2011 | Fukazawa |
| 8,004,198 B2 | 8/2011 | Bakre et al. |
| 8,020,315 B2 | 9/2011 | Nishimura |
| 8,030,129 B2 | 10/2011 | Jeong |
| 8,038,835 B2 | 10/2011 | Hayashi et al. |
| 8,041,197 B2 | 10/2011 | Kasai et al. |
| 8,041,450 B2 | 10/2011 | Takizawa et al. |
| 8,043,972 B1 | 10/2011 | Liu et al. |
| 8,055,378 B2 | 11/2011 | Numakura |
| 8,060,252 B2 | 11/2011 | Gage et al. |
| 8,071,451 B2 | 12/2011 | Uzoh |
| 8,071,452 B2 | 12/2011 | Raisanen |
| 8,072,578 B2 | 12/2011 | Yasuda et al. |
| 8,076,230 B2 | 12/2011 | Wei |
| 8,076,237 B2 | 12/2011 | Uzoh |
| 8,082,946 B2 | 12/2011 | Laverdiere et al. |
| D652,896 S | 1/2012 | Gether |
| 8,092,604 B2 | 1/2012 | Tomiyasu et al. |
| D653,734 S | 2/2012 | Sisk |
| D654,884 S | 2/2012 | Honma |
| D655,055 S | 2/2012 | Toll |
| 8,119,466 B2 | 2/2012 | Avouris |
| 8,137,462 B2 | 3/2012 | Fondurulia et al. |
| 8,137,465 B1 | 3/2012 | Shrinivasan et al. |
| 8,138,676 B2 | 3/2012 | Mills |
| 8,142,862 B2 | 3/2012 | Lee et al. |
| 8,143,174 B2 | 3/2012 | Xia et al. |
| 8,147,242 B2 | 4/2012 | Shibagaki et al. |
| 8,173,554 B2 | 5/2012 | Lee et al. |
| 8,187,951 B1 | 5/2012 | Wang |
| 8,272,516 B2 | 5/2012 | Salvador |
| 8,192,901 B2 | 6/2012 | Kageyama |
| 8,196,234 B2 | 6/2012 | Glunk |
| 8,197,915 B2 | 6/2012 | Oka et al. |
| 8,216,380 B2 | 7/2012 | White et al. |
| 8,231,799 B2 | 7/2012 | Bera et al. |
| D665,055 S | 8/2012 | Yanagisawa et al. |
| 8,241,991 B2 | 8/2012 | Hsieh et al. |
| 8,242,031 B2 | 8/2012 | Mallick et al. |
| 8,252,114 B2 | 8/2012 | Vukovic |
| 8,252,659 B2 | 8/2012 | Huyghabaert et al. |
| 8,252,691 B2 | 8/2012 | Beynet et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,298,951 B1 | 10/2012 | Nakano |
| 8,307,472 B1 | 11/2012 | Saxon et al. |
| 8,309,173 B2 | 11/2012 | Tuominen et al. |
| 8,323,413 B2 | 12/2012 | Son |
| 8,329,599 B2 | 12/2012 | Fukazawa et al. |
| 8,334,219 B2 | 12/2012 | Lee et al. |
| D676,943 S | 2/2013 | Kluss |
| 8,367,528 B2 | 2/2013 | Bauer et al. |
| 8,372,204 B2 | 2/2013 | Nakamura |
| 8,393,091 B2 | 3/2013 | Kawamoto |
| 8,394,466 B2 | 3/2013 | Hong et al. |
| 8,415,259 B2 | 4/2013 | Lee et al. |
| 8,440,259 B2 | 5/2013 | Chiang et al. |
| 8,444,120 B2 | 5/2013 | Gregg et al. |
| 8,445,075 B2 | 5/2013 | Xu et al. |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,492,170 B2 | 7/2013 | Xie et al. |
| 8,496,756 B2 | 7/2013 | Cruse et al. |
| 8,506,713 B2 | 8/2013 | Takagi |
| 8,535,767 B1 | 9/2013 | Kimura |
| D691,974 S | 10/2013 | Osada et al. |
| 8,551,892 B2 | 10/2013 | Nakano |
| 8,563,443 B2 | 10/2013 | Fukazawa |
| 8,569,184 B2 | 10/2013 | Oka |
| 8,591,659 B1 | 11/2013 | Fang et al. |
| 8,592,005 B2 | 11/2013 | Ueda |
| 8,608,885 B2 | 11/2013 | Goto et al. |
| 8,617,411 B2 | 12/2013 | Singh |
| 8,633,115 B2 | 1/2014 | Chang et al. |
| 8,647,722 B2 | 2/2014 | Kobayashi et al. |
| 8,664,627 B1 | 3/2014 | Ishikawa et al. |
| 8,667,654 B2 | 3/2014 | Gros-Jean |
| 8,668,957 B2 | 3/2014 | Dussarrat et al. |
| 8,669,185 B2 | 3/2014 | Onizawa |
| 8,683,943 B2 | 4/2014 | Onodera et al. |
| 8,711,338 B2 | 4/2014 | Liu et al. |
| D705,745 S | 5/2014 | Kurs et al. |
| 8,720,965 B2 | 5/2014 | Hino et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,764,085 B2 | 7/2014 | Urabe |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,790,749 B2 | 7/2014 | Omori et al. |
| 8,802,201 B2 | 8/2014 | Raisanen et al. |
| 8,820,809 B2 | 9/2014 | Ando et al. |
| 8,821,640 B2 | 9/2014 | Cleary et al. |
| 8,841,182 B1 | 9/2014 | Chen et al. |
| 8,845,806 B2 | 9/2014 | Aida et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,883,270 B2 | 11/2014 | Shero et al. |
| 8,901,016 B2 | 12/2014 | Ha et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,933,375 B2 | 1/2015 | Dunn et al. |
| 8,940,646 B1 | 1/2015 | Chandrasekharan |
| D723,153 S | 2/2015 | Borkholder |
| 8,946,830 B2 | 2/2015 | Jung et al. |
| 8,956,983 B2 | 2/2015 | Swaminathan |
| D724,553 S | 3/2015 | Choi |
| D724,701 S | 3/2015 | Yamagishi et al. |
| D725,168 S | 3/2015 | Yamagishi |
| 8,967,608 B2 | 3/2015 | Mitsumori et al. |
| 8,986,456 B2 | 3/2015 | Fondurulia et al. |
| 8,991,887 B2 | 3/2015 | Shin et al. |
| 8,993,054 B2 | 3/2015 | Jung et al. |
| D726,365 S | 4/2015 | Weigensberg |
| D726,884 S | 4/2015 | Yamagishi et al. |
| 9,005,539 B2 | 4/2015 | Halpin et al. |
| 9,017,481 B1 | 4/2015 | Pettinger et al. |
| 9,018,093 B2 | 4/2015 | Tsuji et al. |
| 9,018,111 B2 | 4/2015 | Milligan et al. |
| 9,021,985 B2 | 5/2015 | Alokozai et al. |
| 9,023,737 B2 | 5/2015 | Beynet et al. |
| 9,029,253 B2 | 5/2015 | Milligan et al. |
| 9,029,272 B1 | 5/2015 | Nakano |
| D732,145 S | 6/2015 | Yamagishi |
| D732,644 S | 6/2015 | Yamagishi et al. |
| D733,261 S | 6/2015 | Yamagishi et al. |
| D733,843 S | 7/2015 | Yamagishi et al. |

(56) References Cited

U.S. PATENT DOCUMENTS

| | | |
|---|---|---|
| D734,377 S | 7/2015 | Hirakida |
| D735,836 S | 8/2015 | Yamagishi |
| 9,096,931 B2 | 8/2015 | Yednak et al. |
| 9,117,657 B2 | 8/2015 | Nakano et al. |
| 9,117,866 B2 | 8/2015 | Marquardt et al. |
| D739,222 S | 9/2015 | Chadbourne |
| 9,123,510 B2 | 9/2015 | Nakano et al. |
| 9,136,108 B2 | 9/2015 | Matsushita et al. |
| 9,142,393 B2 | 9/2015 | Okabe et al. |
| 9,169,975 B2 | 10/2015 | Sarin et al. |
| 9,171,714 B2 | 10/2015 | Mori |
| 9,171,716 B2 | 10/2015 | Fukuda |
| D743,513 S | 11/2015 | Yamagishi |
| 9,177,784 B2 | 11/2015 | Raisanen et al. |
| 9,190,263 B2 | 11/2015 | Ishikawa et al. |
| 9,196,483 B1 | 11/2015 | Lee et al. |
| 9,202,727 B2 | 12/2015 | Dunn et al. |
| 9,228,259 B2 | 1/2016 | Haukka et al. |
| 9,240,412 B2 | 1/2016 | Xie et al. |
| 2001/0017103 A1 | 8/2001 | Takeshita et al. |
| 2001/0018267 A1 | 8/2001 | Shinriki et al. |
| 2001/0019777 A1 | 9/2001 | Tanaka et al. |
| 2001/0019900 A1 | 9/2001 | Hasegawa |
| 2001/0028924 A1 | 10/2001 | Sherman |
| 2001/0046765 A1 | 11/2001 | Cappellani et al. |
| 2001/0049202 A1 | 12/2001 | Maeda et al. |
| 2002/0001974 A1 | 1/2002 | Chan |
| 2002/0011210 A1 | 1/2002 | Satoh et al. |
| 2002/0014204 A1 | 2/2002 | Pyo |
| 2002/0064592 A1 | 5/2002 | Datta et al. |
| 2002/0076507 A1 | 6/2002 | Chiang et al. |
| 2002/0079714 A1 | 6/2002 | Soucy et al. |
| 2002/0088542 A1 | 7/2002 | Nishikawa et al. |
| 2002/0098627 A1 | 7/2002 | Pomarede et al. |
| 2002/0108670 A1 | 8/2002 | Baker et al. |
| 2002/0110991 A1 | 8/2002 | Li |
| 2002/0114886 A1 | 8/2002 | Chou et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2002/0197849 A1 | 12/2002 | Mandal |
| 2003/0003635 A1 | 1/2003 | Paranjpe et al. |
| 2003/0010452 A1 | 1/2003 | Park et al. |
| 2003/0012632 A1 | 1/2003 | Saeki |
| 2003/0019428 A1 | 1/2003 | Ku et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0049375 A1 | 3/2003 | Nguyen et al. |
| 2003/0054670 A1 | 3/2003 | Wang et al. |
| 2003/0059535 A1 | 3/2003 | Luo et al. |
| 2003/0059980 A1 | 3/2003 | Chen et al. |
| 2003/0066826 A1 | 4/2003 | Lee et al. |
| 2003/0075925 A1 | 4/2003 | Lindfors et al. |
| 2003/0082307 A1 | 5/2003 | Chung et al. |
| 2003/0091938 A1 | 5/2003 | Fairbairn et al. |
| 2003/0094133 A1 | 5/2003 | Yoshidome et al. |
| 2003/0111963 A1 | 6/2003 | Tolmachev et al. |
| 2003/0134038 A1 | 7/2003 | Paranjpe |
| 2003/0141820 A1 | 7/2003 | White et al. |
| 2003/0157436 A1 | 8/2003 | Manger et al. |
| 2003/0168001 A1 | 9/2003 | Sneh |
| 2003/0170583 A1 | 9/2003 | Nakashima |
| 2003/0180458 A1 | 9/2003 | Sneh |
| 2003/0183156 A1 | 10/2003 | Dando |
| 2003/0192875 A1 | 10/2003 | Bieker et al. |
| 2003/0198587 A1 | 10/2003 | Kaloyeros |
| 2003/0209323 A1 | 11/2003 | Yokogaki |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0013818 A1 | 1/2004 | Moon et al. |
| 2004/0016637 A1 | 1/2004 | Yang |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0029052 A1 | 2/2004 | Park et al. |
| 2004/0036129 A1 | 2/2004 | Forbes et al. |
| 2004/0063289 A1 | 4/2004 | Ohta |
| 2004/0071897 A1 | 4/2004 | Verplancken et al. |
| 2004/0077182 A1 | 4/2004 | Lim et al. |
| 2004/0079960 A1 | 4/2004 | Shakuda |
| 2004/0080697 A1 | 4/2004 | Song |
| 2004/0082171 A1 | 4/2004 | Shin et al. |
| 2004/0101622 A1 | 5/2004 | Park et al. |
| 2004/0103914 A1 | 6/2004 | Cheng et al. |
| 2004/0106249 A1 | 6/2004 | Huotari |
| 2004/0124549 A1 | 7/2004 | Curran |
| 2004/0134429 A1 | 7/2004 | Yamanaka |
| 2004/0144980 A1 | 7/2004 | Ahn et al. |
| 2004/0146644 A1 | 7/2004 | Xia et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0209477 A1 | 10/2004 | Buxbaum et al. |
| 2004/0212947 A1 | 10/2004 | Nguyen |
| 2004/0214445 A1 | 10/2004 | Shimizu et al. |
| 2004/0219793 A1 | 11/2004 | Hishiya et al. |
| 2004/0221807 A1 | 11/2004 | Verghese et al. |
| 2004/0247779 A1 | 12/2004 | Selvamanickam et al. |
| 2004/0261712 A1 | 12/2004 | Hayashi et al. |
| 2004/0266011 A1 | 12/2004 | Lee et al. |
| 2005/0003662 A1 | 1/2005 | Jurisch et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0034674 A1 | 2/2005 | Ono |
| 2005/0037154 A1 | 2/2005 | Koh et al. |
| 2005/0051093 A1 | 3/2005 | Makino et al. |
| 2005/0054228 A1 | 3/2005 | March |
| 2005/0059262 A1 | 3/2005 | Yin et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070729 A1 | 3/2005 | Kiyomori et al. |
| 2005/0072357 A1 | 4/2005 | Shero et al. |
| 2005/0074983 A1 | 4/2005 | Shinriki et al. |
| 2005/0092249 A1 | 5/2005 | Kilpela et al. |
| 2005/0095770 A1 | 5/2005 | Kumagai et al. |
| 2005/0100669 A1 | 5/2005 | Kools et al. |
| 2005/0101154 A1 | 5/2005 | Huang |
| 2005/0106893 A1 | 5/2005 | Wilk |
| 2005/0110069 A1 | 5/2005 | Kil et al. |
| 2005/0120962 A1 | 6/2005 | Ushioda et al. |
| 2005/0123690 A1 | 6/2005 | Derderian et al. |
| 2005/0133161 A1 | 6/2005 | Carpenter et al. |
| 2005/0142361 A1 | 6/2005 | Nakanishi |
| 2005/0145338 A1 | 7/2005 | Park et al. |
| 2005/0153571 A1 | 7/2005 | Senzaki |
| 2005/0173003 A1 | 8/2005 | Laverdiere et al. |
| 2005/0181535 A1 | 8/2005 | Yun et al. |
| 2005/0187647 A1 | 8/2005 | Wang et al. |
| 2005/0191828 A1 | 9/2005 | Al-Bayati et al. |
| 2005/0199013 A1 | 9/2005 | Vandroux et al. |
| 2005/0208718 A1 | 9/2005 | Lim et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0221618 A1 | 10/2005 | AmRhein et al. |
| 2005/0223994 A1 | 10/2005 | Blomiley et al. |
| 2005/0227502 A1 | 10/2005 | Schmitt et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0241763 A1 | 11/2005 | Huang et al. |
| 2005/0255257 A1 | 11/2005 | Choi et al. |
| 2005/0258280 A1 | 11/2005 | Goto et al. |

(56) References Cited

U.S. PATENT DOCUMENTS

| | | |
|---|---|---|
| 2005/0260347 A1 | 11/2005 | Narwankar et al. |
| 2005/0260850 A1 | 11/2005 | Loke |
| 2005/0263075 A1 | 12/2005 | Wang et al. |
| 2005/0263932 A1 | 12/2005 | Heugel |
| 2005/0271813 A1 | 12/2005 | Kher et al. |
| 2005/0274323 A1 | 12/2005 | Seidel et al. |
| 2005/0282101 A1 | 12/2005 | Adachi |
| 2005/0287725 A1 | 12/2005 | Kitagawa |
| 2005/0287771 A1 | 12/2005 | Seamons et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021703 A1 | 2/2006 | Umotoy |
| 2006/0024439 A2 | 2/2006 | Tuominen et al. |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068121 A1 | 3/2006 | Lee et al. |
| 2006/0068125 A1 | 3/2006 | Radhakrishnan |
| 2006/0105566 A1 | 5/2006 | Waldfried et al. |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0163612 A1 | 7/2006 | Kouvetakis et al. |
| 2006/0172531 A1 | 8/2006 | Lin et al. |
| 2006/0191555 A1 | 8/2006 | Yoshida et al. |
| 2006/0193979 A1 | 8/2006 | Meiere et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0251827 A1 | 11/2006 | Nowak |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1 | 11/2006 | Ramaswamy et al. |
| 2006/0264060 A1 | 11/2006 | Ramaswamy et al. |
| 2006/0264066 A1 | 11/2006 | Bartholomew |
| 2006/0266289 A1 | 11/2006 | Verghese et al. |
| 2006/0269692 A1 | 11/2006 | Balseanu |
| 2006/0278524 A1 | 12/2006 | Stowell |
| 2007/0006806 A1 | 1/2007 | Imai |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054499 A1 | 3/2007 | Jang |
| 2007/0059948 A1 | 3/2007 | Metzner et al. |
| 2007/0062453 A1 | 3/2007 | Ishikawa |
| 2007/0065578 A1 | 3/2007 | McDougall |
| 2007/0066010 A1 | 3/2007 | Ando |
| 2007/0066079 A1 | 3/2007 | Kolster et al. |
| 2007/0077355 A1 | 4/2007 | Chacin et al. |
| 2007/0082132 A1 | 4/2007 | Shinriki |
| 2007/0084405 A1 | 4/2007 | Kim |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111545 A1 | 5/2007 | Lee et al. |
| 2007/0116873 A1 | 5/2007 | Li et al. |
| 2007/0123037 A1 | 5/2007 | Lee et al. |
| 2007/0125762 A1 | 6/2007 | Cui et al. |
| 2007/0128538 A1 | 6/2007 | Fairbairn et al. |
| 2007/0134942 A1 | 6/2007 | Ahn et al. |
| 2007/0146621 A1 | 6/2007 | Yeom |
| 2007/0148990 A1 | 6/2007 | Deboer et al. |
| 2007/0155138 A1 | 7/2007 | Tomasini et al. |
| 2007/0158026 A1 | 7/2007 | Amikura |
| 2007/0163440 A1 | 7/2007 | Kim et al. |
| 2007/0166457 A1 | 7/2007 | Yamoto et al. |
| 2007/0166966 A1 | 7/2007 | Todd et al. |
| 2007/0166999 A1 | 7/2007 | Vaarstra |
| 2007/0173071 A1 | 7/2007 | Afzali-Ardakani et al. |
| 2007/0175393 A1 | 8/2007 | Nishimura et al. |
| 2007/0175397 A1 | 8/2007 | Tomiyasu et al. |
| 2007/0186952 A1 | 8/2007 | Honda et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0241688 A1 | 10/2007 | DeVancentis et al. |
| 2007/0248767 A1 | 10/2007 | Okura |
| 2007/0249131 A1 | 10/2007 | Allen et al. |
| 2007/0252532 A1 | 10/2007 | DeVancentis et al. |
| 2007/0251444 A1 | 11/2007 | Gros-Jean et al. |
| 2007/0252244 A1 | 11/2007 | Srividya et al. |
| 2007/0264807 A1 | 11/2007 | Leone et al. |
| 2007/0275166 A1 | 11/2007 | Thridandam et al. |
| 2007/0277735 A1 | 12/2007 | Mokhesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1 | 1/2008 | Ueno et al. |
| 2008/0023436 A1 | 1/2008 | Gros-Jean et al. |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0036354 A1 | 2/2008 | Letz et al. |
| 2008/0038485 A1 | 2/2008 | Lukas |
| 2008/0054332 A1 | 3/2008 | Kim et al. |
| 2008/0054813 A1 | 3/2008 | Espiau et al. |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0069955 A1 | 3/2008 | Hong et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0124197 A1 | 5/2008 | van der Meulen et al. |
| 2008/0124908 A1 | 5/2008 | Forbes et al. |
| 2008/0124946 A1 | 5/2008 | Xiao et al. |
| 2008/0133154 A1 | 6/2008 | Krauss et al. |
| 2008/0149031 A1 | 6/2008 | Chu et al. |

(56) References Cited

U.S. PATENT DOCUMENTS

| | | |
|---|---|---|
| 2008/0152463 A1 | 6/2008 | Chidambaram et al. |
| 2008/0153311 A1 | 6/2008 | Padhi et al. |
| 2008/0173240 A1 | 7/2008 | Furukawahara |
| 2008/0173326 A1 | 7/2008 | Gu et al. |
| 2008/0176375 A1 | 7/2008 | Erben et al. |
| 2008/0178805 A1 | 7/2008 | Paterson et al. |
| 2008/0179715 A1 | 7/2008 | Coppa |
| 2008/0182075 A1 | 7/2008 | Chopra |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0203487 A1 | 8/2008 | Hohage et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0220619 A1 | 9/2008 | Matsushita et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0241384 A1 | 10/2008 | Jeong |
| 2008/0242116 A1 | 10/2008 | Clark |
| 2008/0248310 A1 | 10/2008 | Kim et al. |
| 2008/0257494 A1 | 10/2008 | Hayashi et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0277715 A1 | 11/2008 | Ohmi et al. |
| 2008/0282970 A1 | 11/2008 | Heys et al. |
| 2008/0295872 A1 | 12/2008 | Riker et al. |
| 2008/0299326 A1 | 12/2008 | Fukazawa |
| 2008/0302303 A1 | 12/2008 | Choi et al. |
| 2008/0305246 A1 | 12/2008 | Choi et al. |
| 2008/0305443 A1 | 12/2008 | Nakamura |
| 2008/0315292 A1 | 12/2008 | Ji et al. |
| 2008/0317972 A1 | 12/2008 | Hendriks |
| 2009/0000550 A1 | 1/2009 | Tran et al. |
| 2009/0000551 A1 | 1/2009 | Choi et al. |
| 2009/0011608 A1 | 1/2009 | Nabatame |
| 2009/0020072 A1 | 1/2009 | Mizunaga et al. |
| 2009/0023229 A1 | 1/2009 | Matsushita |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0045829 A1 | 2/2009 | Awazu |
| 2009/0050621 A1 | 2/2009 | Awazu |
| 2009/0061644 A1 | 3/2009 | Chiang et al. |
| 2009/0061647 A1 | 3/2009 | Mallick et al. |
| 2009/0085156 A1 | 4/2009 | Dewey et al. |
| 2009/0090382 A1 | 4/2009 | Morisada |
| 2009/0093094 A1 | 4/2009 | Ye et al. |
| 2009/0095221 A1 | 4/2009 | Tam et al. |
| 2009/0104789 A1 | 4/2009 | Mallick et al. |
| 2009/0107404 A1 | 4/2009 | Ogliari et al. |
| 2009/0120580 A1 | 5/2009 | Kagoshima et al. |
| 2009/0122293 A1 | 5/2009 | Shibazaki |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142935 A1 | 6/2009 | Fukazawa et al. |
| 2009/0146322 A1 | 6/2009 | Weling et al. |
| 2009/0156015 A1 | 6/2009 | Park et al. |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0246971 A1 | 10/2009 | Reid et al. |
| 2009/0250955 A1 | 10/2009 | Aoki |
| 2009/0261331 A1 | 10/2009 | Yang et al. |
| 2009/0269506 A1 | 10/2009 | Okura et al. |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1 | 11/2009 | Sasaki et al. |
| 2009/0304558 A1 | 12/2009 | Patton |
| 2009/0311857 A1 | 12/2009 | Todd et al. |
| 2010/0001409 A1 | 1/2010 | Humbert et al. |
| 2010/0006031 A1 | 1/2010 | Choi et al. |
| 2010/0014479 A1 | 1/2010 | Kim |
| 2010/0015813 A1 | 1/2010 | McGinnis et al. |
| 2010/0024727 A1 | 2/2010 | Kim et al. |
| 2010/0025796 A1 | 2/2010 | Dabiran |
| 2010/0040441 A1 | 2/2010 | Obikane |
| 2010/0041179 A1 | 2/2010 | Lee |
| 2010/0041243 A1 | 2/2010 | Cheng et al. |
| 2010/0055312 A1 | 3/2010 | Kato et al. |
| 2010/0055442 A1 * | 3/2010 | Kellock ............... C23C 16/36 428/319.1 |
| 2010/0075507 A1 | 3/2010 | Chang et al. |
| 2010/0089320 A1 | 4/2010 | Kim |
| 2010/0093187 A1 | 4/2010 | Lee et al. |
| 2010/0102417 A1 | 4/2010 | Ganguli et al. |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126605 A1 | 5/2010 | Stones |
| 2010/0130017 A1 | 5/2010 | Luo et al. |
| 2010/0134023 A1 | 6/2010 | Mills |
| 2010/0136216 A1 | 6/2010 | Tsuei et al. |
| 2010/0140221 A1 | 6/2010 | Kikuchi et al. |
| 2010/0144162 A1 | 6/2010 | Lee et al. |
| 2010/0151206 A1 | 6/2010 | Wu et al. |
| 2010/0159638 A1 | 6/2010 | Jeong |
| 2010/0162752 A1 | 7/2010 | Tabata et al. |
| 2010/0170441 A1 | 7/2010 | Won et al. |
| 2010/0178137 A1 | 7/2010 | Chintalapati et al. |
| 2010/0178423 A1 | 7/2010 | Shimizu et al. |
| 2010/0184302 A1 | 7/2010 | Lee et al. |
| 2010/0193501 A1 | 8/2010 | Zucker et al. |
| 2010/0195392 A1 | 8/2010 | Freeman |
| 2010/0221452 A1 | 9/2010 | Kang |
| 2010/0230051 A1 | 9/2010 | Iizuka |
| 2010/0233886 A1 | 9/2010 | Yang et al. |
| 2010/0243166 A1 | 9/2010 | Hayashi et al. |
| 2010/0244688 A1 | 9/2010 | Braun et al. |
| 2010/0255198 A1 | 10/2010 | Cleary et al. |
| 2010/0255625 A1 | 10/2010 | De Vries |
| 2010/0259152 A1 | 10/2010 | Yasuda et al. |
| 2010/0270675 A1 | 10/2010 | Harada |
| 2010/0275846 A1 | 11/2010 | Kitagawa |
| 2010/0285319 A1 | 11/2010 | Kwak et al. |
| 2010/0294199 A1 | 11/2010 | Tran et al. |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2011/0000619 A1 | 1/2011 | Suh |
| 2011/0006402 A1 | 1/2011 | Zhou |
| 2011/0006406 A1 | 1/2011 | Urbanowicz et al. |
| 2011/0014795 A1 | 1/2011 | Lee |
| 2011/0027999 A1 | 2/2011 | Sparks et al. |
| 2011/0034039 A1 | 2/2011 | Liang et al. |
| 2011/0048642 A1 | 3/2011 | Mihara et al. |
| 2011/0052833 A1 | 3/2011 | Hanawa et al. |
| 2011/0056513 A1 | 3/2011 | Hombach et al. |
| 2011/0056626 A1 | 3/2011 | Brown et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |

(56) References Cited

U.S. PATENT DOCUMENTS

| | | |
|---|---|---|
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0124196 A1 | 5/2011 | Lee |
| 2011/0139748 A1 | 6/2011 | Donnelly et al. |
| 2011/0143032 A1 | 6/2011 | Vrtis et al. |
| 2011/0143461 A1 | 6/2011 | Fish et al. |
| 2011/0159202 A1 | 6/2011 | Matsushita |
| 2011/0159673 A1 | 6/2011 | Hanawa et al. |
| 2011/0175011 A1 | 7/2011 | Ehrne et al. |
| 2011/0183079 A1 | 7/2011 | Jackson et al. |
| 2011/0183269 A1 | 7/2011 | Zhu |
| 2011/0192820 A1 | 8/2011 | Yeom et al. |
| 2011/0198736 A1 | 8/2011 | Shero et al. |
| 2011/0210468 A1 | 9/2011 | Shannon et al. |
| 2011/0220874 A1 | 9/2011 | Hanrath |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256675 A1 | 10/2011 | Avouris |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0265549 A1 | 11/2011 | Cruse et al. |
| 2011/0265951 A1 | 11/2011 | Xu et al. |
| 2011/0275166 A1 | 11/2011 | Shero et al. |
| 2011/0281417 A1 | 11/2011 | Gordon et al. |
| 2011/0283933 A1 | 11/2011 | Makarov et al. |
| 2011/0294075 A1 | 12/2011 | Chen et al. |
| 2011/0308460 A1 | 12/2011 | Hong et al. |
| 2012/0003500 A1 | 1/2012 | Yoshida et al. |
| 2012/0006489 A1 | 1/2012 | Okita |
| 2012/0024479 A1 | 2/2012 | Palagashvili et al. |
| 2012/0032311 A1 | 2/2012 | Gates |
| 2012/0043556 A1 | 2/2012 | Dube et al. |
| 2012/0052681 A1 | 3/2012 | Marsh |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |
| 2012/0114877 A1 | 5/2012 | Lee |
| 2012/0121823 A1 | 5/2012 | Chhabra |
| 2012/0122302 A1 | 5/2012 | Weisman et al. |
| 2012/0128897 A1 | 5/2012 | Xiao et al. |
| 2012/0135145 A1 | 5/2012 | Je et al. |
| 2012/0156108 A1 | 6/2012 | Fondurulia et al. |
| 2012/0160172 A1 | 6/2012 | Wamura et al. |
| 2012/0164327 A1 | 6/2012 | Sato |
| 2012/0164837 A1 | 6/2012 | Tan et al. |
| 2012/0164842 A1 | 6/2012 | Watanabe |
| 2012/0171391 A1 | 7/2012 | Won |
| 2012/0171874 A1 | 7/2012 | Thridandam et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0220139 A1 | 8/2012 | Lee et al. |
| 2012/0225561 A1 | 9/2012 | Watanabe |
| 2012/0240858 A1 | 9/2012 | Taniyama et al. |
| 2012/0263876 A1 | 10/2012 | Haukka et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0305196 A1 | 12/2012 | Mori et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1 | 1/2013 | Tsai |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabai et al. |
| 2013/0019945 A1 | 1/2013 | Hekmatshoar-Tabai et al. |
| 2013/0023129 A1 | 1/2013 | Reed |
| 2013/0048606 A1 | 2/2013 | Mao et al. |
| 2013/0064973 A1 | 3/2013 | Chen et al. |
| 2013/0068970 A1 | 3/2013 | Matsushita |
| 2013/0078392 A1 | 3/2013 | Xiao et al. |
| 2013/0081702 A1 | 4/2013 | Mohammed et al. |
| 2013/0084156 A1 | 4/2013 | Shimamoto |
| 2013/0084714 A1 | 4/2013 | Oka et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0115763 A1 | 5/2013 | Takamure et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa |
| 2013/0168354 A1 | 7/2013 | Kanarik |
| 2013/0180448 A1 | 7/2013 | Sakaue et al. |
| 2013/0183814 A1 | 7/2013 | Huang et al. |
| 2013/0210241 A1 | 8/2013 | Lavoie et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0288480 A1 | 10/2013 | Sanchez et al. |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0295779 A1 | 11/2013 | Chandra et al. |
| 2013/0319290 A1 | 12/2013 | Xiao et al. |
| 2013/0323435 A1 | 12/2013 | Xiao et al. |
| 2013/0330165 A1 | 12/2013 | Wimplinger |
| 2013/0330911 A1 | 12/2013 | Huang et al. |
| 2013/0330933 A1 | 12/2013 | Fukazawa et al. |
| 2013/0337583 A1 | 12/2013 | Kobayashi et al. |
| 2014/0000843 A1 | 1/2014 | Dunn et al. |
| 2014/0014642 A1 | 1/2014 | Elliot et al. |
| 2014/0014644 A1 | 1/2014 | Akiba et al. |
| 2014/0020619 A1 | 1/2014 | Vincent et al. |
| 2014/0027884 A1 | 1/2014 | Tang et al. |
| 2014/0033978 A1 | 2/2014 | Adachi et al. |
| 2014/0036274 A1 | 2/2014 | Marquardt et al. |
| 2014/0048765 A1 | 2/2014 | Ma et al. |
| 2014/0056679 A1 | 2/2014 | Yamabe et al. |
| 2014/0060147 A1 | 3/2014 | Sarin et al. |
| 2014/0062304 A1 | 3/2014 | Nakano et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0094027 A1 | 4/2014 | Azumo et al. |
| 2014/0096716 A1 | 4/2014 | Chung et al. |
| 2014/0099798 A1 | 4/2014 | Tsuji |
| 2014/0103145 A1 | 4/2014 | White et al. |
| 2014/0116335 A1 | 5/2014 | Tsuji et al. |
| 2014/0120487 A1 | 5/2014 | Kaneko |
| 2014/0127907 A1 | 5/2014 | Yang |
| 2014/0141625 A1 | 5/2014 | Fuzawawa et al. |
| 2014/0159170 A1 | 6/2014 | Raisanen et al. |
| 2014/0174354 A1 | 6/2014 | Arai |
| 2014/0175054 A1 | 6/2014 | Carlson et al. |
| 2014/0182053 A1 | 7/2014 | Huang |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0227072 A1 | 8/2014 | Lee et al. |
| 2014/0251953 A1 | 9/2014 | Winkler et al. |

(56) References Cited

U.S. PATENT DOCUMENTS

| | | |
|---|---|---|
| 2014/0251954 A1 | 9/2014 | Winkler et al. |
| 2014/0283747 A1 | 9/2014 | Kasai et al. |
| 2014/0346650 A1 | 11/2014 | Raisanen et al. |
| 2014/0349033 A1 | 11/2014 | Nonaka et al. |
| 2014/0363980 A1 | 12/2014 | Kawamata et al. |
| 2014/0363985 A1 | 12/2014 | Jang et al. |
| 2014/0367043 A1 | 12/2014 | Bishara et al. |
| 2015/0004316 A1 | 1/2015 | Thompson et al. |
| 2015/0004317 A1 | 1/2015 | Dussarrat et al. |
| 2015/0007770 A1 | 1/2015 | Chandrasekharan et al. |
| 2015/0014632 A1 | 1/2015 | Kim et al. |
| 2015/0021599 A1 | 1/2015 | Ridgeway |
| 2015/0024609 A1 | 1/2015 | Milligan et al. |
| 2015/0048485 A1 | 2/2015 | Tolle |
| 2015/0078874 A1 | 3/2015 | Sansoni |
| 2015/0086316 A1 | 3/2015 | Greenberg |
| 2015/0091057 A1 | 4/2015 | Xie et al. |
| 2015/0096973 A1 | 4/2015 | Dunn et al. |
| 2015/0099072 A1 | 4/2015 | Takamure et al. |
| 2015/0132212 A1 | 5/2015 | Winkler et al. |
| 2015/0140210 A1 | 5/2015 | Jung et al. |
| 2015/0147483 A1 | 5/2015 | Fukazawa |
| 2015/0147877 A1 | 5/2015 | Jung |
| 2015/0167159 A1 | 6/2015 | Halpin et al. |
| 2015/0170954 A1 | 6/2015 | Agarwal |
| 2015/0174768 A1 | 6/2015 | Rodnick |
| 2015/0184291 A1 | 7/2015 | Alokozai et al. |
| 2015/0187568 A1 | 7/2015 | Pettinger et al. |
| 2015/0217456 A1 | 8/2015 | Tsuji et al. |
| 2015/0240359 A1 | 8/2015 | Jdira et al. |
| 2015/0267295 A1 | 9/2015 | Hill et al. |
| 2015/0267297 A1 | 9/2015 | Shiba |
| 2015/0267299 A1 | 9/2015 | Hawkins |
| 2015/0267301 A1 | 9/2015 | Hill et al. |
| 2015/0284848 A1 | 10/2015 | Nakano et al. |
| 2015/0287626 A1 | 10/2015 | Arai |
| 2015/0308586 A1 | 10/2015 | Shugrue et al. |
| 2015/0315704 A1 | 11/2015 | Nakano et al. |
| 2016/0013024 A1 | 1/2016 | Milligan et al. |
| 2016/0024656 A1 | 1/2016 | White et al. |
| 2016/0051964 A1 | 2/2016 | Tolle et al. |

FOREIGN PATENT DOCUMENTS

| | | |
|---|---|---|
| CN | 101522943 | 9/2009 |
| CN | 101423937 | 9/2011 |
| DE | 102008052750 | 6/2009 |
| EP | 2036600 | 3/2009 |
| EP | 2426233 | 7/2012 |
| JP | 03-044472 | 2/1991 |
| JP | H04115531 | 4/1992 |
| JP | 06-53210 | 2/1994 |
| JP | 07-130731 | 5/1995 |
| JP | 07-034936 | 8/1995 |
| JP | 7-272694 | 10/1995 |
| JP | H07283149 | 10/1995 |
| JP | 08-181135 | 7/1996 |
| JP | H08335558 | 12/1996 |
| JP | 10-064696 | 3/1998 |
| JP | 10-0261620 | 9/1998 |
| JP | 2845163 | 1/1999 |
| JP | 2001-15698 | 1/2001 |
| JP | 2001-15698 DATE | 12/2001 |
| JP | 2001342570 | 12/2001 |
| JP | 2004014952 | 1/2004 |
| JP | 2004091848 | 3/2004 |
| JP | 2004128019 | 4/2004 |
| JP | 2004134553 | 4/2004 |
| JP | 2004294638 | 10/2004 |
| JP | 2004310019 | 11/2004 |
| JP | 2004538374 | 12/2004 |
| JP | 2005507030 | 3/2005 |
| JP | 2006186271 | 7/2006 |
| JP | 3140111 | 3/2008 |
| JP | 2008060304 | 3/2008 |
| JP | 2008527748 | 7/2008 |
| JP | 2008202107 | 9/2008 |
| JP | 2009016815 | 1/2009 |
| JP | 2009099938 | 5/2009 |
| JP | 2010067940 | 3/2010 |
| JP | 2010097834 | 4/2010 |
| JP | 2010205967 | 9/2010 |
| JP | 2010251444 | 10/2010 |
| JP | 2012089837 | 5/2012 |
| JP | 2012146939 | 8/2012 |
| KR | 20100020834 | 2/2010 |
| TW | I226380 | 1/2005 |
| TW | 200701301 | 1/2007 |
| WO | 1998032893 | 7/1998 |
| WO | 2004008827 | 1/2004 |
| WO | 2004010467 | 1/2004 |
| WO | 2006054854 | 5/2006 |
| WO | 2006056091 | 6/2006 |
| WO | 2006078666 | 7/2006 |
| WO | 2006080782 | 8/2006 |
| WO | 2006101857 | 9/2006 |
| WO | 2007140376 | 12/2007 |
| WO | 2010039363 | 4/2010 |
| WO | 2010118051 | 1/2011 |
| WO | 2011019950 | 2/2011 |
| WO | 2013078065 | 5/2013 |
| WO | 2013078066 | 5/2013 |

OTHER PUBLICATIONS

USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 24, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Non-Final Office Action dated Feb. 16, 2012 in U.S. Appl. No. 12/618,419.

(56) References Cited

OTHER PUBLICATIONS

USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Notice of Allowance dated Apr. 12, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Notice of Allowance dated Jan. 16, 2014 in U.S. Appl. No. 12/847,848.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Notice of Allowance dated Jul. 3, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Oct. 27, 2014 in U.S. Appl. No. 13/169,951.
USPTO; Final Office Action dated May 26, 2015 in U.S. Appl. No. 13/169,591.
USPTO; Non-Final Office Action dated Sep. 1, 2015 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Non-Final Office Action dated Jul. 16, 2014 in U.S. Appl. No. 13/184,351.

(56) References Cited

OTHER PUBLICATIONS

USPTO; Final Office Action dated Feb. 17, 2015 in U.S. Appl. No. 13/184,351.
USPTO; Non-Final Office Action dated Aug. 10, 2015 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Notice of Allowance dated Mar. 28, 2016 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Restriction Requirement dated Oct. 29, 2013 in U.S. Appl. No. 13/439,528.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Non-Final Office Action dated Jul. 2, 2014 in U.S. Appl. No. 13/565,564.

(56) References Cited

OTHER PUBLICATIONS

USPTO; Notice of Allowance dated Nov. 3, 2014 in U.S. Appl. No. 13/565,564.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Uspto; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Non-Final Office Action dated Dec. 8, 2015 in U.S. Appl. No. 13/597,108.
USPTO; Notice of Allowance dated Mar. 27, 2014 in U.S. Appl. No. 13/604,498.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Non-Final Office Action dated Dec. 16, 2014 in U.S. Appl. No. 13/646/,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Non-Final Office Action dated May 28, 2015 in U.S. Appl. No. 13/651,144.
USPTO; Final Office Action dated Nov. 19, 2015 in U.S. Appl. No. 13/651,144.
USPTO; Non-Final Office Action dated Nov. 19, 2015 in U.S. Appl. No. 14/659,437.
USPTO; Non-Final Office Action dated Jun. 18, 2015 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Aug. 5, 2015 in U.S. Appl. No. 13/901,372.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.

(56) References Cited

OTHER PUBLICATIONS

USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Apr. 30, 2015 in U.S. Appl. No. 13/941,216.
USPTO; Non-Final Office Action dated Jul. 30, 2015 in U.S. Appl. No. 13/941,216.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Restriction Requirement Action dated Jan. 28, 2015 in U.S. Appl. No. 14/018,345.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Sep. 9, 2015 in U.S. Appl. No. 14/090,750.
USPTO; Final Office Action dated Feb. 11, 2016 U.S. Appl. No. 14/090,750.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Non-Final Office Action dated Jan. 11, 2016 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Non-Final Office Action dated Sep. 22, 2015 in U.S. Appl. No. 14/219,839.
USPTO; Non-Final Office Action dated Nov. 25, 2015 in U.S. Appl. No. 14/219,879.
USPTO; Final Office Action dated Mar. 25, 2016 in U.S. Appl. No. 14/219,839.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Non-Final Office Action dated Nov. 20, 2015 in U.S. Appl. No. 14/260,701.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Non-Final Office Action dated Oct. 20, 2015 in U.S. Appl. No. 14/281,477.
USPTO1; Notice of Allowance dated Feb. 23, 2016 in U.S. Appl. No. 14/327,134.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Non-Final Office Action dated Nov. 25, 2015 in U.S. Appl. No. 14/598,532.
USPTO; Non-Final Office Action dated Jan. 15, 2016 in U.S. Appl. No. 14/606,364.
USPTO; Non-Final Office Action dated Mar. 3, 2016 in U.S. Appl. No. 14/622,603.
USPTO; Non-Final Office Action dated Mar. 21, 2016 in U.S. Appl. No. 14/659,152.

(56) References Cited

OTHER PUBLICATIONS

USPTO; Final Office Action dated Mar. 17, 2016 in U.S. Appl. No. 14/659,437.
USPTO;Notice of Allowance dated Mar. 25, 2016 in U.S. Appl. No. 14/693,138.
USPTO; Non-Final Office Action dated Mar. 30, 2016 in U.S. Appl. No. 14/808,979.
USPTO; Non-Final Office Action dated Mar. 22, 2016 in U.S. Appl. No. 14/987,420.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
PCT; International Search report and Written Opinion dated Nov. 12, 2010 in Application No. PCT/US2010/030126.
PCT; International Preliminary Report on Patentability dated Oct. 11, 2011 Application No. PCT/US2010/030126.
PCT; International Search report and Written Opinion dated Jan. 20, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Application No. 201080015699.9.
Chinese Patent Office; Office Action dated Jan. 12, 2015 in Application No. 201080015699.9.
Chinese Patent Office; Office Action dated May 24, 2013 in Application No. 201080036764.6.
Chinese Patent Office; Office Action dated Jan. 2, 2014 in Application No. 201080036764.6.
Chinese Patent Office; Office Action dated Jul. 1, 2014 in Application No. 201080036764.6.
Chinese Patent Office; Office Action dated Feb. 8, 2014 in Application No. 201110155056.
Chinese Patent Office; Office Action dated Sep. 16, 2014 in Application No. 201110155056.
Chinese Patent Office; Office Action dated Feb. 9, 2015 in Application No. 201110155056.
Japanese Patent Office; Office Action dated Jan. 25, 2014 in Application No. 2012-504786.
Japanese Patent Office; Office Action dated Dec. 1, 2014 in Application No. 2012-504786.
Korean Patent Office; Office Action dated Dec. 10, 2015 in Application No. 10-2010-0028336.
Taiwan Patent Office; Office Action dated Jul. 4, 2014 in Application No. 099110511.
Taiwan Patent Office; Office Action dated Dec. 19, 2014 in Taiwan Application No. 099127063.
Bearzotti, et al., "Fast Humidity Response of a Metal Halide-Doped Novel Polymer," Sensors and Actuators B, 7, pp. 451-454, (1992).
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chang et al. "Small-Subthreshold-Swing and Low-Voltage Flexible Organic Thin-Film Transistors Which Use HfLaO as the Gate Dielectric," IEEE Electron Device Letters, 30, 2, IEEE Electron Device Society 133-135 (2009).
Chen et al., "A Self-Aligned Airgap Interconnect Scheme," IEEE International Interconnect Technology Conference, 1-3, 146-148 (2009).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) 114-116 (2013).
Crowell, "Chemical methods of thin film deposition: Chemical vapor deposition, atomic layer deposition, and related technologies," Journal of Vacuum Science & Technology A 21.5, S88-S95 (2003).
Cui et al., "Impact of Reductive N2/H2 Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma Aid and Pecvd, 35th IEEE PVCS, Jun. (2010).
Drummond et al., "Hydrophobic Radiofrequency Plasma-Deposited Polymer Films: Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma Chemistry on the Damage Induced Porous SiCOH Dielectrics," IBM Research Division, RC23683 (W0508-008), Materials Science, 1-19 (2005).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Heo et al., "Structural Characterization of Nanoporous Low-Dielectric Constant SiCOH Films Using Organosilane Precursors," NSTI-Nanotech, vol. 4, 122-123 (2007).
H.J. Yun et al., "Comparison of Atomic Scale Etching of Poly-Si in Inductively Coupled Ar and He Plasmas," Korean Journal of Chemical Engineering, 24, 670-673 (2007).
Jung et al., "Double Patterning of Contact Array with Carbon Polymer," Proc. Of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of The Electrochemical Society, 153 (10) C701-C706 (2006).
Kim et al., "Passivation Effect on Low-k S/OC Dielectrics by H2 Plasma Treatment," Journal of the Korean Physical Society, 40, 1, 94-98 (2002).
Kim et al., "Characteristics of Low Temperaure High Quality Silicon Oxide by Plasma Enhanced Atomic Layer Deposition with In-Situ Plasma Densification Process," The Electrochemical Society, ECS Transactions, College of Information and Communication Engineerign, Sungkyunkwan University, 53(1), 321-329 (2013).
King, Plasma Enhanced Atomic Layer Deposition of SiNx: H and SiO2, J. Vac. Sci. Technol., A29(4) (2011).
Kobayshi et al. "Temperature Dependence of SiO2 Film Growth with Plasma-Enhanced Atomic Layer Deposition," International Journal on the Science and Technology of Condensed Matter, 520, 3994-3998, (2012).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).

(56) References Cited

OTHER PUBLICATIONS

Koutsokeras et al. Texture and Microstructure Evolution in Single-Phase TixTa1-xN Alloys of Rocksalt Structure. Journal of Applied Physics, 110, 043535-1-043535-6, (2011).

Krenek et al. "IR Laser CVD of Nanodisperse Ge—Si—Sn Alloys Obtained by Dielectric Breakdown of GeH4/SiH4/SnH4 Mixtures", NanoCon, Brno, Czech Republic, EU (2014).

Kurosawa et al., "Synthesis and Characterization of Plasma-Polymerized Hexamethyldisiloxane Films," Thin Solid Films, 506-507, 176-179 (2006).

Lieberman, et al., "Principles of Plasma Discharges and Materials Processing," Second Edition, 368-381.

Lim et al., "Low-Temperature Growth of SiO2 Films by Plasma-Enhanced Atomic Layer Deposition," ETRI Journal, 27 (1), 118-121 (2005).

Liu et al., "Research, Design, and Experimen of End Effector for Wafer Transfer Robot," Industrial Robot: An International Journal, 79-91 (2012).

Mackus et al., "Optical Emission Spectroscopy as a Tool for Studying Optimizing, and Monitoring Plasma-Assisted Atomic Layer Deposition Processes," Journal of Vacuum Science and Technology, 77-87 (2010).

Maeno, "Gecko Tape Using Carbon Nanotubes," Nitto Denko Gihou, 47, 48-51.

Maeng et al., "Electrical properties of atomic layer disposition Hf02 and HfOxNy on Si Substrates with Various Crystal Orientations," Journal of the Electrochemical Society, 155, Department of Materials Science and Engineering, Pohang University of Science and Technology, H267-H271 (2008).

Marsik et al., "Effect of Ultraviolet Curing Wavelength on Low-k Dielectric Material Properties and Plasma Damage Resistance," Sciencedirect.com, 519, 11, 3619-3626 (2011).

Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).

Morishige et al., "Thermal Desorption and Infrared Studies of Ammonia Amines and Pyridines Chemisorbed on Chromic Oxide," J.Chem. Soc., Faraday Trans. 1, 78, 2947-2957 (1982).

Mukai et al., "A Study of CD Budget in Spacer Patterning Technology," Proc. Of SPIE, 6924, 1-8 (2008).

Nogueira et al., "Production of Highly Hydrophobic Films Using Low Frequency and High Density Plasma," Revista Brasileira de Aplicacoes de Vacuo, 25(1), 45-53 (2006).

Novaro et al., "Theoretical Study on a Reaction Pathway of Ziegler-Natta-Type Catalysis," J. Chem. Phys. 68(5), 2337-2351 (1978).

Radamson et al.,"Growth of Sn-alloyed Group IV Materials for Photonic and Electronic Applications", Manufacturing Nano Structures, 5, 129-144,.

Schmatz et al., "Unusual Isomerization Reactions in 1.3-Diaza-2-Silcyclopentanes," Organometallics, 23, 1180-1182 (2004).

Scientific and Technical Information Center EIC 2800 Search Report dated Feb. 16, 2012.

S.D. Athavale et al., "Realization of Atomic Layer Etching of Silicon", Journal of Vacuum Science and Technology B, 14, 3702-3705 (1996).

Shamiivia et al., "PDL Oxide Enabled Doubling," Proc. Of SPIE, 6924, 69240D, 1-10 (2008).

Varma, et al., "Effect of Metal Halides on Thermal, Mechanical, and Electrical Properties of Polypyromelitimide Films," Journal of Applied Polymer Science, 32, 3987-4000, (1986).

Wirths, et al, "SiGeSn Growth tudies Using Reduced Pressure Chemical Vapor Deposition Towards Optoeleconic Applications," This Soid Films, 557, 183-187 (2014).

Yun et al., "Behavior of Various Organosilicon Molecules in PECVD Processes for Hydrocarbon-Doped Silicon Oxide Films," Solid State Phenomena, 124-126, 347-350 (2007).

* cited by examiner

METHOD FOR PROTECTING LAYER BY FORMING HYDROCARBON-BASED EXTREMELY THIN FILM

BACKGROUND OF THE INVENTION

Field of the Invention

The present invention relates generally to a method for protecting a layer, including a method for capping a doped layer to block diffusion of dopants, by forming a hydrocarbon-based extremely thin film by plasma-enhanced atomic layer deposition (PEALD).

Related Art

A SiN film can be formed by plasma-enhanced atomic layer deposition (PEALD) at a temperature of 400° C. or less without causing chemical or physical damage to an underlying layer, and thus, application of the film as an impurity-dispersion blocking film, a pore-seal film for low-k dielectric film, and a protective film for next-generation memory devices has been studied. However, as the size of semiconductor devices has been reduced, further thinning of these films is in demand. Also, since lowering the process temperature is in demand, it becomes more difficult to obtain films having sufficient chemical resistance and barrier properties.

For example, a dopant thin film such as a doped silicon oxide film (e.g., borosilicate glass (BSG) and phosphosilicate glass (PSG) film) can be deposited by an ALD process as a solid state diffusion or solid state doping (SSD) layer over a semiconductor substrate in a structure such as a FinFET structure. However, as illustrated in (a) in FIG. 2 (which is a schematic representation indicating a schematic cross sections of a partially fabricated integrated circuit according to a comparative example), when a dopant thin film 26 deposited on a silicon substrate 25 is exposed, dopant elements 28 such as B and P are dissociated from the dopant thin film 26 with time (referred to as aging) during storage and/or during a subsequent annealing process, and as a result, in a subsequent annealing process, sufficient dopant elements do not diffuse to the substrate. Thus, in order to prevent the aging of dopant elements from a dopant thin film, as illustrated in (b) in FIG. 2 (which is a schematic representation indicating a schematic cross sections of a partially fabricated integrated circuit according to a comparative example), a cap film 27 is deposited on top of the dopant thin film 26 as a dispersion blocking film. As the cap film 27, non-doped silicon glass, SiN film, or SiO film is typically used. However, although dispersion of dopant elements can be suppressed by the formation of the cap film, chemical resistance of the cap film is degraded, i.e., wet etch rate becomes high, when the dopant concentration in the dopant thin film is high, as illustrated in FIG. 3 which is a schematic representation indicating a schematic cross section of a partially fabricated integrated circuit after etching according to a comparative example, showing that layers 32c on sidewalls of a substrate 33 enclosed by dotted circles are thinner than layers 32a, 32b on top and bottom.

In order to manage the above problems, by increasing the thickness of the dopant thin film so as to increase the concentration of dopant elements in the dopant thin film, it may be possible to increase the amount of dopant elements to be diffused to the substrate. Also, by increasing the thickness of the cap film so as to block dispersion of the dopant elements to a higher degree, it may be possible to increase the amount of dopant elements to be diffused to the substrate. However, the increase of thickness of the dopant thin film or the increase of thickness of the cap film may interfere with the standard fabrication processes.

The above discussion of problems and solutions and any other discussions disclosed in this disclosure in relation to the related art has been included solely for the purposes of providing a context for the present invention, and should not be taken as an admission that any or all of the discussion was known at the time the invention was made.

SUMMARY OF THE INVENTION

Some embodiments provide a method for protecting a layer, comprising: (i) providing a substrate having a target layer; and (ii) forming a protective layer on the target layer, said protective layer contacting and covering the target layer and containing a hydrocarbon-based layer constituting at least an upper part of the protective layer, which hydrocarbon-based layer is formed by plasma-enhanced atomic layer deposition (PEALD) using an alkylaminosilane precursor and a noble gas without a reactant. In some embodiments, the target layer is a doped layer which may be a dopant thin film formed by SSD processes. In some embodiments, the protective layer is a cap layer which replaces a conventional cap layer in its entirety. In some embodiments, the protective layer is an additional cap layer formed on top of a conventional cap layer. In some embodiments, the protective layer can effectively block dispersion of dopant elements dissociated from the dopant thin film during storage and during a subsequent annealing process so as to increase the concentration of dopant elements in an underlying layer, e.g., a silicon substrate, on which the dopant thin film is formed, while improving chemical resistance of the layer covered by the protective layer. In some embodiments, the protective layer can also be deposited before depositing a dopant thin film for suppressing oxidation of an underlying layer and improving adhesion of the dopant thin film with the underlying layer. In some embodiments, the protective layer can be applied to a layer other than a dopant thin film, where, for example, the protective layer is formed on an underlying layer, e.g., a silicon substrate, before depositing a silicon oxide film or titanium oxide film, for example, on the underlying layer for suppressing oxidation of the underlying layer and improving adhesion with the underlying layer.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1A:
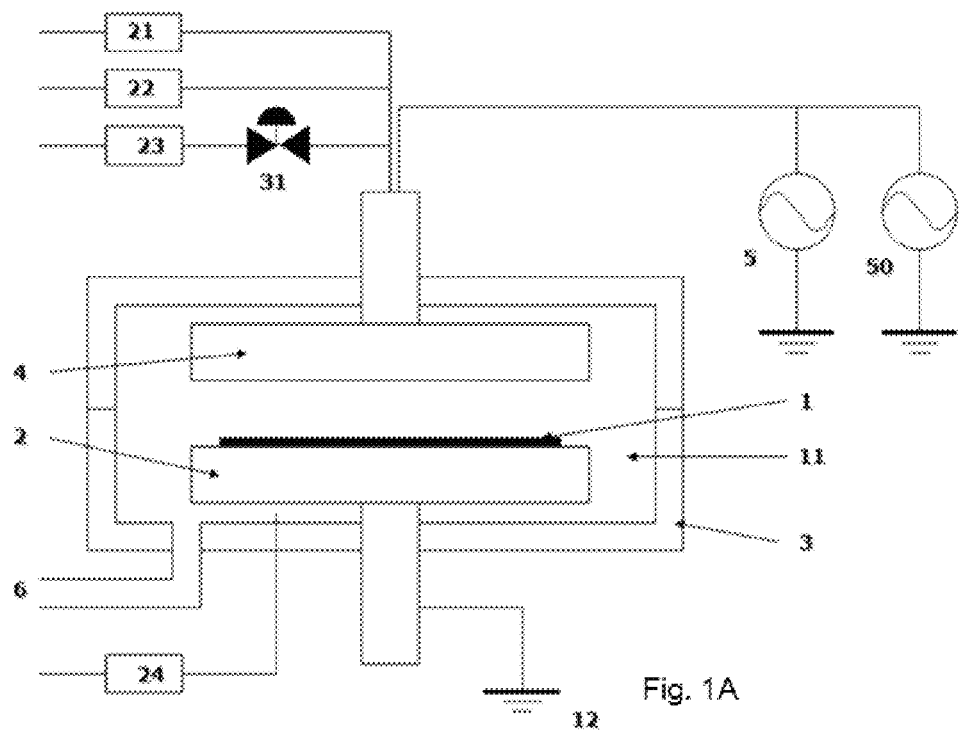
FIG. 1A is a schematic representation of a PEALD (plasma-enhanced atomic layer deposition) apparatus for depositing a protective film usable in an embodiment of the present invention.

In this disclosure, "gas" may include vaporized solid and/or liquid and may be constituted by a single gas or a mixture of gases. In this disclosure, a process gas introduced to a reaction chamber through a showerhead may be comprised of, consist essentially of, or consist of a silicon-containing gas and an additive gas. The silicon-containing gas and the additive gas can be introduced as a mixed gas or separately to a reaction space. The silicon-containing gas can be introduced with a carrier gas such as a noble gas. A gas other than the process gas, i.e., a gas introduced without passing through the showerhead, may be used for, e.g., sealing the reaction space, which includes a seal gas such as a noble gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers.

Further, in this disclosure, the article "a" or "an" refers to a species or a genus including multiple species unless specified otherwise. The terms "constituted by" and "having" refer independently to "typically or broadly comprising", "comprising", "consisting essentially of", or "consisting of" in some embodiments. Also, in this disclosure, any defined meanings do not necessarily exclude ordinary and customary meanings in some embodiments.

Additionally, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation. In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

Some aspects of the present invention will be explained with respect to preferred embodiments. However, the present invention is not limited to the preferred embodiments.

In an embodiment, a method for protecting a layer comprises: (i) providing a substrate having a target layer; and (ii) forming a protective layer on the target layer, said protective layer contacting and covering an entire concerned area of the target layer and containing a hydrocarbon-based layer constituting at least an upper part of the protective layer, which hydrocarbon-based layer is formed by plasma-enhanced atomic layer deposition (PEALD) using an alkylaminosilane precursor and a noble gas without a reactant. The term "protecting" refers generally to covering or shielding from exposure, damage, or destruction, and typically excludes repairing damage. For example, typically, the "protecting" does not include repairing damage of a porous low-k film having pores of less than 1 nm in diameter or nanometer scale pores, such as those disclosed in U.S. Pat. No. 8,785,215, and U.S. Patent Application Publication No. 2010/0055442, the disclosure of which is incorporated by reference to the extent such disclosure does not conflict with the present disclosure. The term "hydrocarbon-based layer" refers generally to a layer characterized by hydrocarbons, constituted mainly or predominantly by hydrocarbons, constituted by hydrocarbon derivatives, categorized in hydrocarbon films, and/or having a main skeleton substantially constituted by hydrocarbons. For example, a hydrocarbon-based layer is constituted by 50 to 95 atomic % (typically 65 to 85 atomic %) of hydrocarbon (consisting of carbon atoms and hydrogen atoms) or 30 to 70 atomic % of carbon (typically 40 to 60 atomic %) and 20 to 40 atomic % of hydrogen (typically 25 to 35 atomic %) wherein the content of carbon is higher than the content of hydrogen. The "hydrocarbon-based layer" may be referred to simply as "hydrocarbon layer". The term "precursor" refers generally to a compound that participates in the chemical reaction that produces another compound, and particularly to a compound that constitutes a film matrix or a main skeleton of a film, whereas the term "reactant" refers to a compound, other than a precursor, that activates a precursor, modifies a precursor, or catalyzes a reaction of a precursor. The "reactant" does not include noble gases. Typical reactants include nitrogen, oxygen, hydrogen, ammonia, etc. In some embodiments, the hydrocarbon-based layer is formed by PEALD using a process gas consisting essentially of or consisting of an alkylaminosilane precursor (one or more species) and a noble gas (one or more species). In some embodiments, the process gas does not include halide, $C_xO_y$ (e.g., CO, $C_2O$, $CO_2$, $C_3O_2$, $CO_3$, and $C_5O_2$) and $N_xO_y$ (NO, $N_2O$, $NO_2$, $N_2O_3$, $N_2O_4$, and $N_2O_5$).

In some embodiments, the hydrocarbon-based layer is constituted by a hydrocarbon polymer containing silicon and nitrogen, wherein silicon and nitrogen are typically derived from the precursor, since no reactant is used. In some embodiments, silicon is contained in an amount of less than 20 atomic % (e.g., 15 atomic % or less), and nitrogen is contained in an amount of less than 10 atomic % (e.g., 8 atomic % or less) of the protective layer.

In some embodiments, the target layer is a doped layer. In some embodiments, the doped layer is a doped silicate glass layer, wherein the dopant (which refers generally to an element introduced into a semiconductor to establish either p-type (acceptors) or n-type (donors) conductivity) is selected from the group consisting of boron (B), phosphorous (P), arsenic (As), and antimony (Sb). Typically, the doped silicate glass layer is constituted by borosilicate glass or phosphosilicate glass. The protective layer can effectively block dissociation of the dopant elements from the doped layer during storage and during a subsequent annealing process. Further, the chemical resistance of the doped layer can be improved by the protective layer. In some embodiments, the doped layer can be formed by SSD processes or any other suitable processes, including any conventional methods such as plasma doping, ion-assisted deposition and doping (IADD), spin-on coating, sub-atmospheric pressure chemical vapour deposition (SACVD), or ALD, can be used in some embodiments. For example, in some embodiments, the SSD processes disclosed in U.S. Patent Application Publication No. 2013/0115763 can be used to form a doped layer, the disclosure of which is herein incorporated to the extent such disclosure does not conflict with the present disclosure.

In some embodiments, the target layer is a non-porous layer. In some embodiments, the non-porous layer includes, but is not limited to, the above-discussed doped layer and a silicon substrate. The "non-porous" layer refers generally to a layer other than a porous layer which has pores of 1 nm or less or nanometer-scale pores, and a porosity of 30% or more as defined in, e.g., U.S. Pat. No. 8,785,215, the disclosure of which is herein incorporated to the extent such disclosure does not conflict with the present disclosure.

In some embodiments, the protective layer can be applied to a layer other than a dopant thin film, where, for example, the protective layer is formed on an underlying layer, e.g., a silicon substrate, before depositing a silicon oxide film or titanium oxide film, for example, on the underlying layer for suppressing oxidation of the underlying layer and improving adhesion with the underlying layer. In some embodiments, the protective layer can also be deposited before and after depositing a dopant thin film, silicon oxide film, or titanium oxide film for suppressing oxidation of an underlying layer and improving adhesion of the dopant thin film, silicon oxide film, or titanium oxide film with the underlying layer and with a layer on top of the film.

In some embodiments, the alkylaminosilane for depositing the protective layer is one or more compounds selected from the group consisting of bisdiethylaminosilane (BDEAS), biszimethylaminosilane (BDMAS), hexylethylaminosilane (HEAD), tetraethylaminosilane (TEAS), tert-butylaminosilane (TBAS), bistert-butylaminosilena (BT-BAS), bisdimethylaminodimethylaminosilane (BDMADMS), heptametyhlsilazane (HMDS), trimethysylyldiethlamine (TMSDEA), trimethylsyledimethlamine (TMSDMA), trimethyltoribinylcycletrisilazane (TMT-VCTS), tristrimetylhydroxyamine (TTMSHA), bisdimethylsaminomethylsilane (BDMAMS), and dimetyhlsilyldimethlamine (DMSDMA).

As a noble gas, Ar, He, Ne, Kr, and Xe can be used singly or in any combination of two or more.

In some embodiments, the protective layer is comprised of two discrete layers constituted by a primary layer and a secondary layer contacting and covering the primary layer, which secondary layer is the hydrocarbon-based layer, wherein the step of forming the protective layer comprises: (a) forming a silicon nitride or oxide layer as the primary layer on the target layer; and (b) continuously forming the hydrocarbon-based layer as the secondary layer on the primary layer. Typically, the primary layer is a primary cap layer (which may hereinafter be referred to simply as a "cap layer") which can be formed by any suitable processes, including any conventional methods such as low-pressure CVD or PEALD (such as those disclosed in U.S. Patent Application Publication No. 2014/0141625 and No. 2013/0330933 and U.S. patent application Ser. No. 14/622,603, each disclosure of which is herein incorporated to the extent such disclosure does not conflict with the present disclosure), can be used in some embodiments. Typically, the secondary layer is a secondary cap layer which is a hydrocarbon-based layer (which may hereinafter be referred to as an "H-cap layer"). In some embodiments, the primary layer is formed by plasma-enhanced cyclic deposition using a precursor, a reactant gas, and a noble gas, wherein the precursor contains silicon and hydrocarbon, and the secondary layer is formed using the precursor and the noble gas without the reactant gas. For example, the H-cap layer is formed from CHx elements which are included in the alkylaminosilane precursor used for forming the primary cap layer, and thus, in some embodiments, no new precursor material is required for forming the H-cap layer. Typically, a reactant is used for forming the primary cap layer in combination with the alkylaminosilane precursor, whereas no reactant is used for forming the H-cap layer in combination with the alkylaminosilane precursor, so that the H-cap layer can be formed simply by stopping the reactant flow into a reaction chamber. In some embodiments, the secondary layer is formed without using any gas other than those used for forming the primary layer.

Alternatively, in some embodiments, the primary layer is constituted by silicon nitride or non-doped silicate glass. A skilled artisan can select an appropriate primary layer for the intended purposes, considering the type of the underlying layer, the type of dopant elements, the concentration of the dopant elements, the process conditions, etc., in view of this disclosure as a matter of routine experimentation.

In some embodiments, a thickness of the primary layer is about 1 nm to about 10 nm (e.g., about 1.5 nm to about 6.0 nm), and a thickness of the secondary layer is more than zero and about less than 1.0 nm (e.g., about 0.05 nm to 0.2 nm). Even though the secondary layer is extremely thin, the secondary layer can significantly suppress dispersion or dissociation of dopant elements from the doped layer via the primary layer before a subsequent annealing process and during the annealing process, and can improve chemical resistance, particularly on the sidewalls, and can further suppress oxidation of the primary layer. The hydrocarbon-based layer (the secondary layer) is typically hydrophobic and has a high density (e.g., 1.0 to 2.0 g/cm$^3$). The hydrocarbon-based layer may be constituted by a single or multiple layers, each layer satisfying the profiles or characteristics of a hydrocarbon-based layer.

In some embodiments, the protective layer consists essentially of the hydrocarbon-based layer, e.g., an H-cap layer is substantially the only layer deposited on a dopant thin film without another cap layer, wherein the H-cap layer contains no less than 50 atomic % of hydrocarbons, and there is no cap layer (such as non-doped silicon glass, silicon nitride, and silicon oxide) containing less than 50 atomic % of hydrocarbons. In some embodiments, a thickness of the hydrocarbon-based layer is more than zero but less than about 5 nm (e.g., 0.3 nm to 3 nm). The protective layer consisting essentially of the hydrocarbon-based layer may include a natural oxide layer which may have a thickness of 0.5 nm to 2.0 nm (typically about 1.3 nm). When depositing layers in an oxygen-free environment through the entire processes, formation of a natural oxide layer can be avoided. In some embodiments, the step of providing the substrate and the step of forming the protective layer are conducted in the same reaction chamber.

In some embodiments, after depositing the protective layer, the protective layer is annealed so that dopant elements such as boron, phosphorous, and arsenic can be diffused into the silicon substrate.

Exemplary embodiments will be explained below with reference to the drawings. However, the exemplary embodiments are not intended to limit the present invention.

Figure 4:
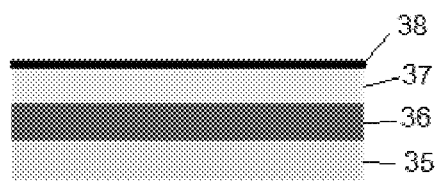
FIG. 4 is a schematic representation indicating a schematic cross section of a partially fabricated integrated circuit according to an embodiment of the present invention.

FIG. 4 is a schematic representation indicating a schematic cross section of a partially fabricated integrated circuit according to an embodiment of the present invention. In this embodiment, a dopant thin film 36 (e.g., BSG, PSG) is deposited on a silicon substrate 35 by, e.g., SSD, and a cap film 37 (e.g., NSG, SiN, SiO) is deposited on the dopant thin film 36 by PEALD or CVD, and continuously an H-cap film (hydrocarbon film) 38 is deposited on the cap film 37 by PEALD using alkylaminosilane precursor and a noble gas without a reactant. In this disclosure, the word "continuously" refers to at least one of the following: without breaking a vacuum, without being exposed to air, without opening a chamber, as an in-situ process, without interruption as a step in sequence, without changing process conditions, and without causing chemical changes on a substrate surface between steps, depending on the embodiment. In some embodiments, an auxiliary step such as purging or other negligible step in the context does not count as a step, and thus, the word "continuously" does not exclude being intervened with the auxiliary step. The H-cap film 38 can significantly suppress dispersion or dissociation of dopant elements from the dopant thin film 36 via the cap film 37 before a subsequent annealing process and during the annealing process, and can improve chemical resistance, particularly on the sidewalls, and can further suppress oxidation of the cap film. The H-cap film is typically hydrophobic.

Figure 5:
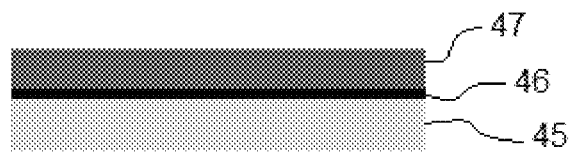
FIG. 5 is a schematic representation indicating a schematic cross section of a partially fabricated integrated circuit according to another embodiment of the present invention.

FIG. 5 is a schematic representation indicating a schematic cross section of a partially fabricated integrated circuit according to another embodiment of the present invention. In this embodiment, a hydrocarbon-based film 46 is deposited on a silicon substrate 45 by PEALD as a protective layer before depositing a metal oxide film or silicon nitride or oxide film 47 thereon by ALD or CVD. The protective layer 46 can suppress oxidation of the underlying layer, i.e., the silicon substrate in this embodiment, and can improve adhesion of the oxide or nitride film to the underlying layer.

Figure 7:
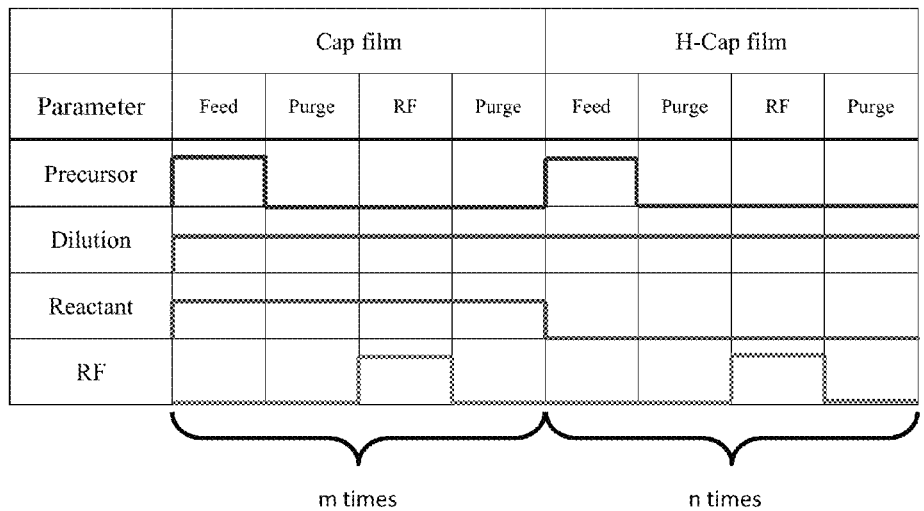
FIG. 7 illustrates a process sequence of formation of a cap film and an H-cap film (hydrocarbon-based film) according to an embodiment of the present invention.

FIG. 7 illustrates a process sequence of formation of a cap film and an H-cap film (hydrocarbon-based film) according to an embodiment of the present invention, where the protective layer is constituted by the cap film and the H-cap film. In this embodiment, both the cap film and the H-cap film are deposited by PEALD using the same precursor and the same dilution gas, and typically, both films are continuously deposited in the same reactor, wherein the difference between PEALD for the cap film and PEALD for the H-cap film is that a reactant gas is used in the PEALD process for the cap film whereas no reactant gas is used in the PEALD process for the H-cap film. The PEALD process for the cap film includes in sequence: (i) a feed step where a precursor is supplied to a reaction space while supplying a dilution gas and a reactant gas without applying RF power to the reaction space, whereby the precursor is chemisorbed on a substrate; (ii) a purge step where no precursor is supplied to the reaction space while continuously supplying the dilution gas and the reactant gas to the reaction space without applying RF power to the reaction space, whereby excess precursor components are removed from the substrate surface; (iii) an RF step where no precursor is supplied to the reaction space while continuously supplying the dilution gas and the reactant gas to the reaction space, and RF power is applied to the reaction space, whereby a monolayer of a cap film is formed; and (iv) a purge step where no precursor is supplied to the reaction space while continuously supplying the dilution gas and the reactant gas to the reaction space without applying RF power to the reaction space, whereby non-reacted components and reaction by-products, if any, are removed from the substrate surface. Steps (i) to (iv) constitute one cycle, and the cycle is repeated m times (m is an integer) as desired depending on the target thickness of the cap film. The PEALD process for the H-cap film begins immediately after the completion of the PEALD process for the cap film. The PEALD process for the H-cap film can be conducted in the same sequence of steps as in the PEALD for the cap film and under the same conditions as in the PEALD process for the cap film, except that no reactant gas is supplied throughout the process. As with the PEALD process for the cap film, steps (i) to (iv) constituting one cycle are repeated n times (n is an integer) as desired depending on the target thickness of the cap film.

Figure 8:
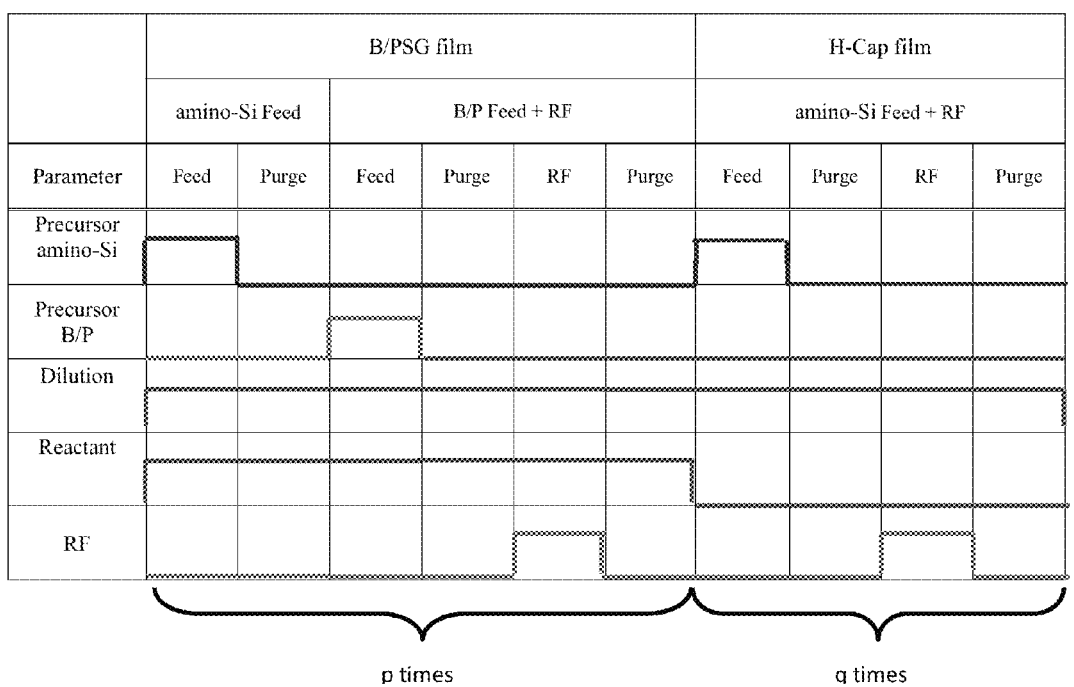
FIG. 8 illustrates a process sequence of formation of a BSG/PSG film and an H-cap film (hydrocarbon-based film) according to another embodiment of the present invention.

FIG. 8 illustrates a process sequence of formation of a BSG/PSG film and an H-cap film (hydrocarbon-based film) according to another embodiment of the present invention, where the protective layer is constituted by the H-cap film only (without a cap film). In this embodiment, the PEALD process for the H-cap film is substantially the same as that for the H-cap film illustrated in FIG. 7. In this embodiment, the dopant thin film is boron-doped or phosphorous-doped silicon glass film (B/PSG film). Both the B/PSG film and the H-cap film are deposited by PEALD using the same aminosilane precursor and the same dilution gas, and typically, both films are continuously deposited in the same reactor. The PEALD process for the B/PSG film includes in sequence: (i) a feed step where a aminosilane precursor without a dopant precursor (B/P precursor) is supplied to a reaction space while supplying a dilution gas and a reactant gas without applying RF power to the reaction space, whereby the precursor is chemisorbed onto a substrate; (ii) a purge step where neither aminosilane precursor nor dopant precursor is supplied to the reaction space while continuously supplying the dilution gas and the reactant gas to the reaction space without applying RF power to the reaction space, whereby excess precursor components are removed from the substrate surface; (iii) a feed step where a dopant precursor without an aminosilane precursor is supplied to the reaction space while continuously supplying the dilution gas and the reactant gas without applying RF power to the reaction space, whereby the precursor is chemisorbed onto the substrate; (iv) a purge step where neither aminosilane precursor nor dopant precursor is supplied to the reaction space while continuously supplying the dilution gas and the reactant gas to the reaction space without applying RF power to the reaction space, whereby excess precursor components are removed from the substrate surface; (v) an RF step where neither aminosilane precursor nor dopant precursor is supplied to the reaction space while continuously supplying the dilution gas and the reactant gas to the reaction space, and RF power is applied to the reaction space, whereby a monolayer of a dopant thin film is formed; and (vi) a purge step where neither aminosilane precursor nor dopant precursor is supplied to the reaction space while continuously supplying the dilution gas and the reactant gas to the reaction space without applying RF power to the reaction space, whereby non-reacted components and reaction by-products, if any, are removed from the substrate surface. Steps (i) to (vi) constitute one cycle, and the cycle is repeated p times (p is an integer) as desired depending on the target thickness of the B/PSG film. The PEALD process for the H-cap film begins immediately after the completion of the PEALD process for the B/PSG film. The PEALD process for the H-cap film can be conducted under the same conditions as in the PEALD process for the B/PSG film, except that neither dopant precursor nor reactant gas is supplied throughout the process. As with the PEALD process for the B/PSG film, the steps constituting one cycle are repeated q times (q is an integer) as desired depending on the target thickness of the H-cap film.

In some embodiments, the PEALD process for the cap film illustrated in FIG. 7 can be conducted between the PEALD process for the B/PSG film and that for the H-cap film illustrated in FIG. 8, so that the above three processes can be conducted continuously in the same reaction chamber.

In some embodiments, the hydrocarbon-based layer (H-cap layer) constituting the protective layer can be deposited by PEALD under conditions shown in Table 1 below. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle. In the embodiments represented by Table 1, the precursor is fed to the reaction chamber together with a carrier gas which controls flow of the precursor.

TABLE 1

(the numbers are approximate)

| | Conditions for Hydrocarbon-based layer |
|---|---|
| Precursor pulse (sec): Supply time | 0.05 to 20 sec (preferably 0.1 to 1.0 sec) |
| Substrate temperature (° C.) | 50 to 500° C. (preferably 50 to 500° C.) |
| Pressure (Torr) | 0.1 to 7.5 Torr (preferably 1.5 to 6.0 Torr) |
| Carrier gas | He, Ar |
| Flow rate of carrier gas (sccm) | 50 to 6000 sccm (preferably 1000 to 4000 sccm) |
| Purge upon the precursor pulse (sec) | 0.05 to 20 sec (preferably 0.1 to 5.0 sec) |
| Dilution gas | He, Ar |
| Flow rate of dilution gas (continuous) (sccm) | 50 to 6000 sccm (preferably 1000 to 4000 sccm) |
| RF frequency (MHz) | 13.56 to 60 MHz |
| RF power (W) | 10 to 1000 W (preferably 50 to 800 W for a 300-mm wafer) |
| RF power pulse (sec) | 0.05 to 20 sec (preferably 0.1 to 5.0 sec) |
| Purge upon the RF power pulse (sec) | 0.05 to 20 sec (preferably 0.1 to 5.0 sec) |
| Duration of one cycle | 0.2 to 80 sec (preferably 0.4 to 5.0 sec) |
| Number of cycles repeated | 1 to 10000 (preferably 1 to 1000) |

The pressure is set preferably at 200 to 500 Pa, considering purging efficiency and reliability of ignition of plasma at low RF power. Further, the gap between upper and lower electrodes (between a showerhead and a susceptor) is set preferably at 7 to 15 mm. In some embodiments, the above conditions are maintained throughout all deposition processes.

In some embodiments, non-H-cap layer may be formed by PEALD, one cycle of which is conducted under conditions shown in Table 2 below.

TABLE 2

(the numbers are approximate)

| | Conditions for non-Hydrocarbon-based layer |
|---|---|
| Precursor pulse (sec): Supply time | 0.05 to 20 sec (preferably 0.1 to 5.0 sec) |
| Substrate temperature (° C.) | 50 to 500° C. (preferably 50 to 500° C.) |
| Pressure (Torr) | 0.1 to 7.5 Torr (preferably 1.5 to 6.0 Torr) |
| Carrier gas | He, Ar |
| Flow rate of carrier gas (sccm) | 50 to 6000 sccm (preferably 1000 to 4000 sccm) |
| Purge upon the precursor pulse (sec) | 0.05 to 20 sec (preferably 0.1 to 5.0 sec) |
| Dilution gas | $N_2$, He, Ar (preferably $N_2$) |
| Flow rate of dilution gas (continuous) (sccm) | 50 to 6000 sccm (preferably 1000 to 4000 sccm) |
| Reactant gas | $N_2$, O2 |
| Flow rate of reactant gas (continuous) (sccm) | 50 to 6000 sccm (preferably 1000 to 4000 sccm) |
| RF frequency (MHz) | 13.56 to 60 MHz |
| RF power (W) | 10 to 1000 W (preferably 50 to 800 W for a 300-mm wafer) |
| RF power pulse (sec) | 0.05 to 20 sec (preferably 0.1 to 5.0 sec) |
| Purge upon the RF power pulse (sec) | 0.05 to 20 sec (preferably 0.1 to 5.0 sec) |
| Duration of one cycle | 0.2 to 80 sec (preferably 0.4 to 5.0 sec) |
| Number of cycles repeated | 1 to 10000 (preferably 1 to 1000) |

In some embodiments, the dopant thin film may be formed as an SSD layer by PEALD, one cycle of which is conducted under conditions shown in Table 3 below.

TABLE 3

(the numbers are approximate)
Conditions for B/PSG Film Deposition

| | |
|---|---|
| Substrate temperature | 50 to 500° C. (preferably 50 to 500° C.) |
| Pressure | 0.1 to 7.5 Torr (preferably 1.5 to 6.0 Torr) |
| Silicon precursor | Silicon-containing precursor such as bis(diethylamino)silane (BDEAS), |
| Silicon precursor pulse | 0.05 to 20 sec (preferably 0.1 to 5.0 sec) |
| Silicon precursor purge | 0.05 to 20 sec (preferably 0.1 to 5.0 sec) |
| Dopant precursor | B/P-containing precursor such as B/P-triethoxide |
| Dopant precursor pulse | 0.05 to 20 sec (preferably 0.1 to 5.0 sec) |
| Dopant precursor purge | 0.05 to 20 sec (preferably 0.1 to 5.0 sec) |
| Reactant | Oxidizing gas such as oxygen, ozone |
| Flow rate of reactant (continuous) | 50 to 6000 sccm (preferably 1000 to 4000 sccm) |
| Dilution gas (noble gas) | He, Ar |
| Flow rate of dilution gas (continuous) | 50 to 6000 sccm (preferably 1000 to 4000 sccm) |
| RF power (13.56 MHz) for a 300-mm wafer | 50 to 1000 W (preferably 50 to 800 W for a 300-mm wafer) |
| RF power pulse | 0.05 to 20 sec (preferably 0.1 to 5.0 sec) |
| Purge upon the RF power pulse | 0.05 to 20 sec (preferably 0.1 to 5.0 sec) |
| Thickness of film | 0.1 to 100 nm (preferably 0.5 to 50 nm) |

The dopant precursor may be provided with the aid of a carrier gas. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle. The oxygen plasma may be generated in situ, for example in an oxygen gas that flows continuously throughout the ALD cycle. In other embodiments the oxygen plasma may be generated remotely and provided to the reaction chamber.

As mentioned above, each pulse or phase of each ALD cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. In some embodiments the pulse time of one or more of the reactants can be reduced such that complete saturation is not achieved and less than a monolayer is adsorbed on the substrate surface. However, in some embodiments the dopant precursor step is not self-limiting, for example, due to decomposition or gas phase reactions.

In some embodiments, the silicon precursor and the dopant precursor are both provided prior to any purge step. Thus, in some embodiments a pulse of silicon precursor is provided, a pulse of dopant precursor is provided, and any unreacted silicon and dopant precursor is purged from the reaction space. The silicon precursor and the dopant precursor may be provided sequentially, beginning with either the silicon precursor or the dopant precursor, or together. In some embodiments, the silicon precursor and dopant precursor are provided simultaneously. The ratio of the dopant precursor to the silicon precursor may be selected to obtain a desired concentration of dopant in the deposited thin film.

The ratio of silicon precursor cycles to dopant precursor cycles may be selected to control the dopant concentration in the ultimate film deposited by the PEALD process. For example, for a low dopant density, the ratio of dopant precursor cycles to silicon precursor cycles may be on the order of 1:10. For a higher concentration of dopant, the ratio may range up to about 1:1 or higher such as 1.5:1, 2:1, 2.5:1, 3:1, 4:1, etc. In some embodiments all of the deposition cycles in an ALD process may be dopant precursor cycles.

The ratio of deposition cycles comprising dopant to deposition cycles that do not include dopant (such as the ratio of dopant precursor cycles to silicon precursor cycles, or the ratio of dopant oxide cycles to silicon precursor cycles) may be referred to as the control knob. For example, if one dopant precursor cycle is provided for every four silicon precursor cycles, the control knob is 0.25. If no undoped oxide cycles are used, the control knob may be considered to be infinite.

By controlling the ratio of dopant precursor cycles to silicon precursor cycles, the dopant concentration can be controlled from a density range of about 0 atoms of dopant to about $5E+22/cm^3$ atoms of dopant. Density may be measured, for example, by SIMS (secondary-ion-probe mass spectrometry).

In addition, the dopant density can be varied across the thickness of the film by changing the ratio of dopant precursor cycles to silicon precursor cycles during the deposition process. For example, a high density of dopant may be provided near the substrate surface (lower ratio of silicon precursor cycles to dopant precursor cycles), such as near a Si surface and the density of dopant at the top surface away from the substrate may be low (higher ratio of silicon precursor cycles to dopant precursor cycles). In other embodiments a high density of dopant may be provided at the top surface with a lower density near the substrate surface.

In some embodiments, a dopant thin layer is formed by providing a dopant precursor cycle at certain intervals in a silicon oxide deposition process. The interval may be based, for example, on cycle number or thickness. For example, one or more dopant precursor deposition cycles may be provided after each set of a predetermined number of silicon precursor deposition cycles, such as after every 10, 20, 50, 100, 200, 500 etc. cycles. In some embodiments, undoped silicon oxide deposition cycles may be repeated until a silicon oxide layer of a predetermined thickness is reached, at which point one or more dopant precursor cycles are then carried out. This process is repeated such that dopant is incorporated in the film at specific thickness intervals. For example, one or more dopant precursor cycles may be provided after each 5 nm of undoped $SiO_2$ that is deposited. The process is then repeated until a dopant thin layer of a desired thickness and composition has been deposited.

In some embodiments, an in-situ plasma pre-treatment of the substrate is conducted before a dopant thin layer deposition to enhance doping efficiency into the Si fin. For example, $H_2$ plasma pre-treatment can provide some tuning space for FinFET device design. The pre-treatment is not limited to only $H_2$ plasma. In some embodiments, the pre-treatment plasma may be selected from Ar, He, $H_2$, fluorine-containing gas, and their mixed gas plasma.

In some embodiments, the ALD cycle disclosed in U.S. Patent Application Publication No. 2013/0115763, the disclosure of which is incorporated to the extent such disclosure does not conflict with the present disclosure, can be employed for an arsenosilicate glass (ASG) film.

In some embodiments, after depositing the protective layer, the substrate is subjected to annealing to diffuse dopant elements into the substrate. In some embodiments, the annealing may be conducted under conditions shown in Table 4 below.

TABLE 4

(the numbers are approximate)
Conditions for Annealing

| | |
|---|---|
| Substrate temperature | 500 to 1200° C. (preferably 700 to 1100° C.) |
| Pressure | 1 to 101325 Pa (preferably 90000 to 101325 Pa) |
| Atmosphere | He, $N_2$, $H_2$ |
| Duration of annealing | 0.1 to 600 sec (preferably 0.5 to 300 sec) |

The embodiments will be explained with respect to preferred embodiments. However, the present invention is not limited to the preferred embodiments.

FIG. 1A is a schematic view of a PEALD apparatus, desirably in conjunction with controls programmed to conduct the sequences described below, usable in some embodiments of the present invention. In this figure, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz-500 kHz) 50 to one side, and electrically grounding 12 to the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided, through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). In some embodiments, the deposition of ASG film, surface treatment, and deposition of SiN cap are performed in the same apparatus such as that described above, so that all the steps can continuously be conducted without exposing the substrate to air or other oxygen-containing atmosphere. In some embodiments, a remote plasma unit can be used for exciting a gas.

Figure 1B:
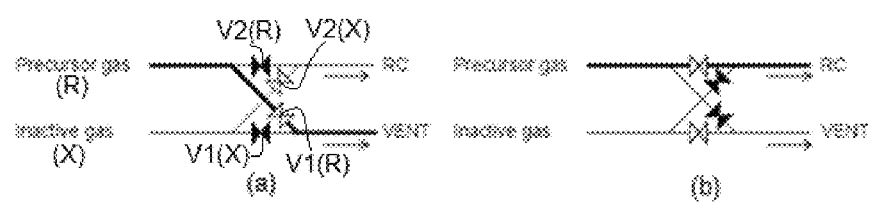
FIG. 1B illustrates a schematic representation of switching flow of an inactive gas and flow of a precursor gas usable in an embodiment of the present invention.
Figure 2:
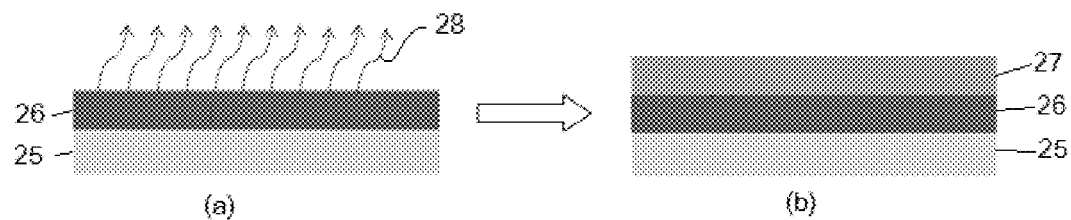
FIG. 2 is a schematic representation of processes (a) to (b), indicating schematic cross sections of a partially fabricated integrated circuit according to a comparative example.
Figure 3:
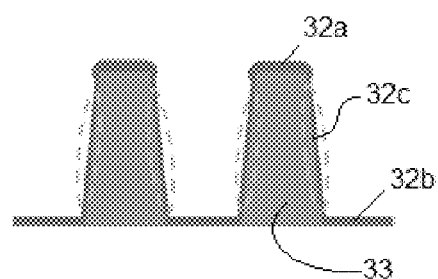
FIG. 3 is a schematic representation indicating a schematic cross section of a partially fabricated integrated circuit after etching according to a comparative example, showing that layers on sidewalls enclosed by dotted circles are thinner than layers on top and bottom.

In some embodiments, in the apparatus depicted in FIG. 1A, in place of the pulse flow control valve 31, a system of switching flow of an inactive gas and flow of a precursor gas can be used. FIG. 1B illustrates a schematic representation of such a switching flow system. In (a) in FIG. 1B, valves V1 (X) and V2 (R) are closed, and valves V1 (R) and V2 (X) are open, so that a precursor gas flows to a vent via valve V1 (R), and an inactive gas flows to a reactor via valve V2 (X). In (b) in FIG. 1B, by simultaneously closing valves V1 (R) and V2 (X) and opening valves V1 (X) and V2 (R), the precursor gas is instantly directed to flow to the reactor, and the inactive gas is instantly directed to flow to the vent, without substantial changes in the flow rate while maintaining continuous flows. The vent can be set downstream of an exhaust, for example. In some embodiments, the pressure of the reaction space is substantially constant while conducting cyclic deposition processes, wherein the pressure can be maintained by, e.g., switching precursor flow and inactive gas flow while continuously feeding the precursor and the inactive gas using a gas flow system illustrated in FIG. 1B which is explained later.

In some embodiments, formation of a protective layer can be continuously conducted in a chamber different from the chamber used for the deposition of a dopant thin film using a cluster apparatus (a substrate is transferred between chambers via a wafer-handling chamber without being exposed to air).

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

The present invention is further explained with reference to working examples below. However, the examples are not intended to limit the present invention. In the examples where conditions and/or structures are not specified, the skilled artisan in the art can readily provide such conditions and/or structures, in view of the present disclosure, as a matter of routine experimentation. Also, the numbers applied in the specific examples can be modified by a range of at least ±50% in some embodiments, and the numbers are approximate.

EXAMPLES

Example 1

Figure 6:
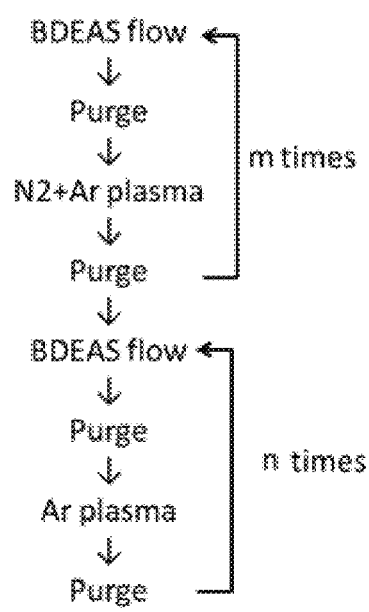
FIG. 6 illustrates a process flow of formation of a cap film and an H-cap film (hydrocarbon-based film) according to an embodiment of the present invention.

In this example, a hydrocarbon-based layer (H-cap layer) was deposited on a SiN film formed on a Si substrate (Φ300 mm) by PEALD using the PEALD apparatus illustrated in FIG. 1A (including a modification illustrated in FIG. 1B) with the sequence illustrated in FIG. 6 which corresponds generally to the sequence illustrated in FIG. 7. As illustrated in FIG. 6, by repeating m times a step of feeding an aminosilane precursor (bisdiethylaminosilane (BDEAS)) and a step of applying a $N_2$+Ar plasma alternately under the conditions shown in Table 5, a SiN film having a thickness of 1.5 to 6 nm was deposited. Thereafter, continuously, by repeating n times (30 times) a step of feeding the aminosilane material and a step of applying an Ar plasma alternately under the conditions shown in Table 6, an H-cap layer having a thickness of about 0.1 nm was deposited on the SiN film.

TABLE 5

(the numbers are approximate)

| | Conditions for SiN film |
|---|---|
| Precursor pulse (sec): Supply time | 3.0 Sec |
| Substrate temperature (° C.) | 250° C. |
| Pressure (Torr) | 1.9 Torr |
| Carrier gas | Ar |
| Flow rate of carrier gas (sccm) | 2000 Sccm |
| Purge upon the precursor pulse (sec) | 2.0 Sec |
| Dilution gas | Ar |
| Flow rate of dilution gas (continuous) (sccm) | 400 sccm |
| Reactant gas | N2 |
| Flow rate of reactant gas (continuous) (sccm) | 1000 sccm |
| RF frequency (MHz) | 13.56 MHz |
| RF power (W) | 300 W |
| RF power pulse (sec) | 3.0 sec |
| Purge upon the RF power pulse (sec) | 0.1 sec |
| Duration of one cycle | 8.1 sec |
| Number of cycles repeated | 66~264 times |

TABLE 6

(the numbers are approximate)

| | Conditions for Hydrocarbon-based layer |
|---|---|
| Precursor pulse (sec): Supply time | 0.5 sec |
| Substrate temperature (° C.) | 250° C. |
| Pressure (Torr) | 1.9 Torr |
| Carrier gas | Ar |
| Flow rate of carrier gas (sccm) | 2000 sccm |
| Purge upon the precursor pulse (sec) | 0.8 sec |
| Dilution gas | Ar |
| Flow rate of dilution gas (continuous) (sccm) | 400 sccm |
| RF frequency (MHz) | 13.56 MHz |
| RF power (W) | 300 W |
| RF power pulse (sec) | 0.4 sec |
| Purge upon the RF power pulse (sec) | 0.1 sec |
| Duration of one cycle | 1.8 sec |
| Number of cycles repeated | 30 times |

As comparative examples, a SiN film was deposited in the same manner as in Example 1 without forming an H-cap layer (Comparative Example 1), and a SiN film was deposited in the same manner as in Example 1, followed by applying thereon an Ar plasma without the aminosilane precursor (i.e., without forming an H-cap layer) (Comparative Example 2). The obtained substrates with the layer(s) were tested in terms of chemical resistance. The results are shown in FIG. 9.

Figure 9:
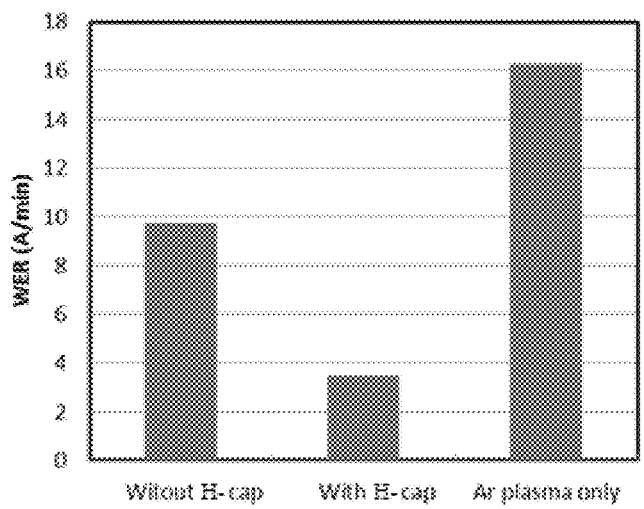
FIG. 9 is a graph showing wet etching rates of layers according to an embodiment of the present invention ("With H-cap") in relation to those of comparative examples ("Without H-cap" and "Ar plasma only").

FIG. 9 is a graph showing wet etch rates of layers according to Example 1 ("With H-cap") in relation to those of Comparative Examples 1 and 2 ("Without H-cap" and "Ar plasma only", respectively). The "WER" (wet etch rate) refers to a wet etch rate (A/min) using DHF (at 1:100). By forming the H-cap layer in Example 1 although the thickness of the H-cap layer was as small as about 0.1 nm, the wet etch rate of the film was reduced surprisingly to about ⅓ of that of the film without the H-cap layer (Comparative Example 1). When applying an Ar plasma without the aminosilane precursor on the SiN film (Comparative Example 2), the wet etch rate of the film was not improved but degraded.

The composition of the H-cap layer was analyzed by Rutherford backscattering Spectrometry (RBS) and Hydrogen Forward Scattering (HFS), using a silicon substrate on which solely an H-cap layer was deposited at a thickness of 45 nm for the analytical purposes. As shown in Table 7 below, it was confirmed that the H-cap layer was a hydrocarbon-based layer which was constituted by a hydrocarbon polymer containing silicon and nitrogen. The layer can include impurities, negligible elements, and undetectable elements without being expressly so indicated in the composition. The detectable amount varies depending on the composition analysis method.

TABLE 7

| | RBS analysis | | | | | |
|---|---|---|---|---|---|---|
| | Si | Ar | N | C | O | H |
| at % | 11 | 2 | 7 | 47 | 2 | 30 |

Example 2

Figure 10:
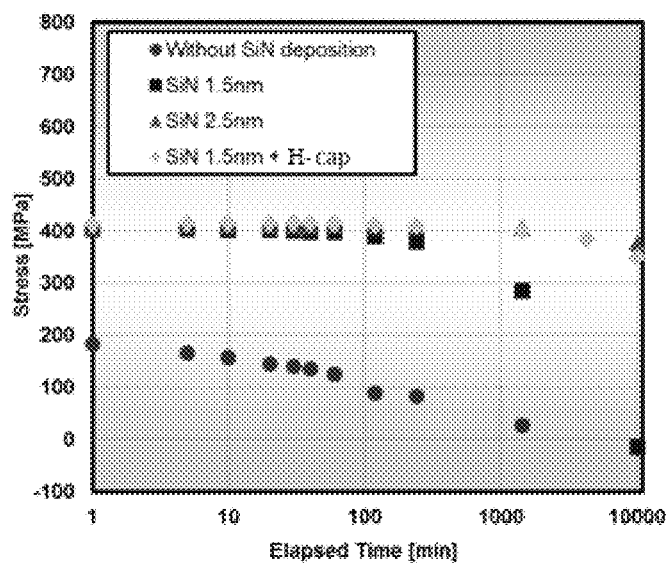
FIG. 10 is a graph showing film stress of layers according to an embodiment of the present invention (◇) in relation to those of comparative examples (●, ■, and ▲).

In this example, a $SiO_2$ film which had high moisture absorbency was deposited using TEOS on a substrate, and then annealed at a temperature of 400° C. to dehydrate the film. Thereafter, a SiN film having a thickness of 1.5 nm was deposited on the $SiO_2$ film, followed by deposition of an H-cap layer in a manner which was substantially the same as in Example 1. Changes in film stress of the resultant film with time were measured immediately after completion of the deposition processes. As comparative examples, no SiN film was deposited on the $SiO_2$ film (Comparative Example 3), a SiN film having a thickness of 1.5 nm was deposited in the same manner as in Example 2 without forming an H-cap layer (Comparative Example 4), and a SiN film having a thickness of 2.5 nm was deposited in the same manner as in Example 2 without forming an H-cap layer (Comparative Example 5). The results are shown in FIG. 10. FIG. 10 is a graph showing film stress of layers according to Example 2 ("◇ SiN 1.5 nm+H-cap") in relation to those of Comparative Example 3 ("● Without SiN deposition"), Comparative Example 4 ("■ SiN 1.5 nm"), and Comparative Example 5 ("▲ SiN 2.5 nm").

As shown in FIG. 10, when no SiN film was deposited ("● Without SiN deposition"), film stress changed with time to the compressive side as the $SiO_2$ film absorbed moisture. When a SiN film having a thickness of 1.5 nm was deposited without an H-cap layer ("■ SiN 1.5 nm"), film stress changed with time to the compressive side as the $SiO_2$ film absorbed moisture through the 1.5-nm thick SiN film which did not sufficiently block moisture permeation. However, when a SiN film having a thickness of 2.5 nm was deposited without an H-cap layer ("▲ SiN 2.5 nm"), changes in film stress with time were suppressed, i.e., the 2.5-nm thick SiN film effectively blocked moisture permeation. When a SiN film having a thickness of 1.5 nm was deposited with an H-cap layer ("◇ SiN 1.5 nm+H-cap"), despite the fact that the thickness of the H-cap layer was as thin as 0.1 nm and the thickness of the SiN film was as thin as 1.5 nm in Comparative Example 4 ("■ SiN 1.5 nm"), changes in stress with time were suppressed, i.e., the 1.5-nm thick SiN film with the H-cap layer sufficiently blocked moisture permeation to the same extent as when the thickness of a SiN film was 2.5 nm ("▲ SiN 2.5 nm"). It was confirmed that an H-cap layer can impart sufficient blocking properties to a thin SiN film without increasing the thickness of the SiN film (the use of an H-cap layer can reduce the thickness of a SiN film by about 20% to 60%, e.g., 40%, without degrading its blocking properties). An H-cap layer can be applied not only to a SiN film but also to a SiO film or non-doped SG.

Examples 3 and 4

In this example, a hydrocarbon-based layer (H-cap layer) was deposited on a BSG or PSG film formed on a Si substrate (Φ300 mm) by PEALD using the PEALD apparatus illustrated in FIG. 1A (including a modification illustrated in FIG. 1B) with the sequence illustrated in FIG. 8 under conditions shown in Table 8 below. A SiO cap film was deposited in a manner substantially similar to that for depositing the H-cap film, except that a reactant gas ($O_2$) was fed to the reaction chamber.

TABLE 8

| | | B/PSG film | | | |
|---|---|---|---|---|---|
| | | AminoSi Feed | B/P Feed + RF | SiO cap film | H-cap film |
| Depo rate | SiO [times] | 1 | 0 | NA | NA |
| | B/P [times] | 0 | 10 | | |

TABLE 8-continued

| | | B/PSG film | | | |
|---|---|---|---|---|---|
| | | AminoSi Feed | B/P Feed + RF | SiO cap film | H-cap film |
| Bottle Temp | [° C.] | 35.0 | 35.0 | 50.0 | 35.0 |
| BTL Ar | [sccm] | 2,000 | 2,000 | 2,000 | 2,000 |
| O2/DCM | [sccm] | 1,000 | 1,000 | 1,000 | 0 |
| Ar/DCM | [sccm] | 1,000 | 1,000 | 1,000 | 1,000 |
| Seal He/DCM | [sccm] | 200 | 200 | 200 | 200 |
| RC Press | [Pa] | 400 | 400 | 400 | 400 |
| HRF | [W] | NA | 200 | 800 | 500 |
| SUS Temp | [° C.] | 300 | 300 | 300 | 300 |
| SHD Temp | [° C.] | 150 | 150 | 150 | 150 |
| Wal Temp | [° C.] | 130 | 130 | 130 | 130 |
| Gap | [mm] | 7.5 | 7.5 | 7.5 | 7.5 |
| Shift time [sec] | Source Feed | 0.3 | 0.3 | 0.3 | 0.3 |
| | Source Purge | 0.9 | 0.8 | 0.4 | 0.4 |
| | RF-ON | 0 | 0.4 | 0.2 | 0.2 |
| | Post Purge | 0 | 0.1 | 0.1 | 0.1 |
| | Cycle time [sec] | 1.2 | 1.6 | 1.0 | 1.0 |

In the table, "AminoSi Feed" denotes a step of forming a SiO sub-layer using a bisdiethylaminosilane (BDEAS) precursor; "B/P Feed+RF" denotes a step of forming a boron-/phosphorus sub-layer using a boron-/phosphorus-triethoxide precursor in combination with application of RF power; "SiO [times]" denotes the number of cycles of forming the SiO sub-layer relative to the number of cycles of forming the B/P sub-layer; "B/P [times]" denotes the number of cycles of forming the B/P sub-layer relative to the number of cycles of forming the SiO sub-layer; "Bottle Temp" denotes a temperature of a bottle storing a liquid precursor; "BLT Ar" denotes an Ar flow rate flowing through the bottle, representing a flow of the precursor; "/DCM" denotes a flow rate per a dual-chamber module; "RC Press" denotes a pressure of a reaction chamber; "HRF" denotes a power of high-frequency RF; "SUS Temp" denotes a temperature of a susceptor; "SHD Temp" denotes a temperature of a showerhead; "Wall Temp" denotes a temperature of a wall of the reaction chamber; "Gap" denotes a distance between the showerhead and the susceptor.

Based on the processes described above, four layer structures shown in Table 9 were produced:

TABLE 9

| | Com. Ex. 6 | Ex. 3 | Com. Ex. 7 | Ex. 4 |
|---|---|---|---|---|
| BSG film | 2.0 nm (CK = 10/1) | 2.0 nm (CK = 10/1) | 0 | 0 |
| PSG film | 0 | 0 | 1.5 nm (CK = 10/1) | 1.5 nm (CK = 10/1) |
| SiO cap film | 2.0 nm (28 cycles) | 0 | 0.5 nm (7 cycles) | 0 |
| H-cap film | 0 | 2.0 nm (280 cycles) | 0 | 0.5 nm (70 cycles) |

In the above, "CK" denotes a cycle ratio of the number of cycles of forming a B/P sub-layer to the number of cycles of forming a SiO sub-layer.

Figure 12:
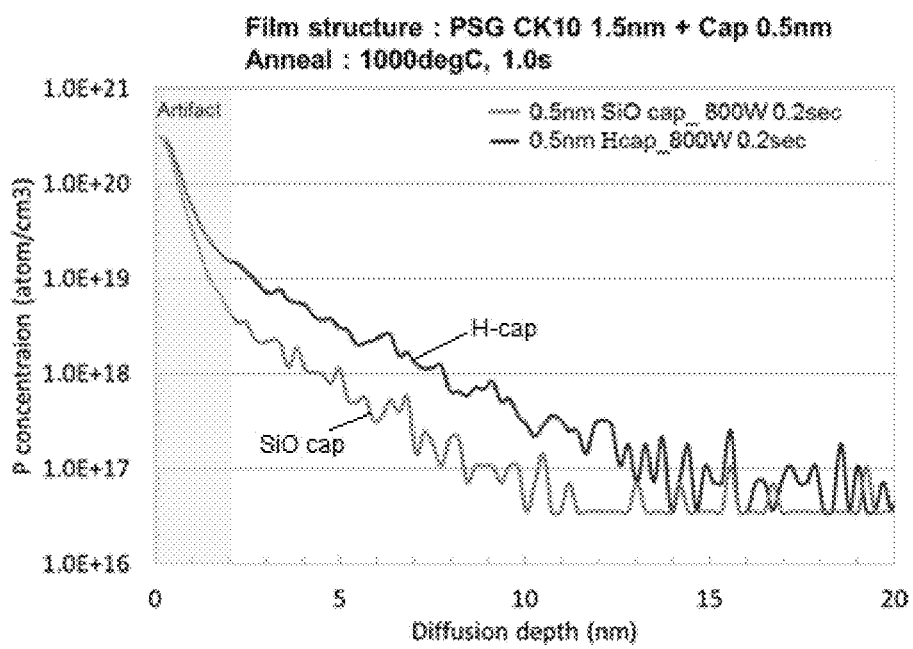
FIG. 12 is a graph showing Phosphorus concentration (atom/$cm^3$) in layers according to an embodiment of the present invention ("H-cap") in relation to that of a comparative example ("SiO cap").
Figure 13A:
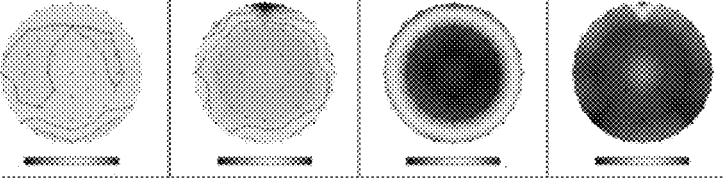
FIG. 13A shows film uniformity when the capping structures were changed according to embodiments of the present invention ("H-Cap") in relation to comparative examples ("SiO Cap").
Figure 13B:
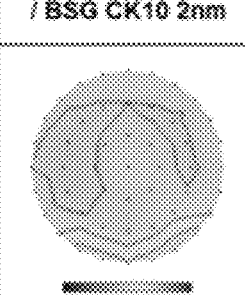
FIG. 13B shows color versions of images of thin-film thickness profile measurement by 2D color map analysis of films shown in FIG. 13A.
Figure 13B:
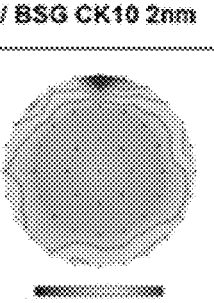
Figure 13B:
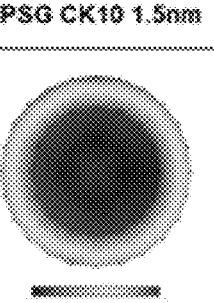
Figure 13B:

The resultant films were tested in terms of thickness uniformity. The results are shown in FIGS. 11-13B. FIG. 13A shows film uniformity when the capping structures were changed according to Examples 3 and 4 and ("H-Cap") in relation to Comparative Examples 6 and 7 ("SiO Cap"). FIG. 13B shows color versions of images of thin-film thickness profile measurement by 2D color map analysis of films shown in FIG. 13A. As shown in FIG. 13A, the total film thickness appeared to be thicker than was designed. This was because the silicon substrate had a natural oxide layer on its surface which was formed when being exposed to air while being stored in a clean room. The thickness of the natural oxide layer were determined to be about 1.3 nm, and thus, considering the thickness of the natural oxide layer and also considering a tolerance (e.g., a 2-nm film may have an actual thickness of 2.0 to 2.5 nm), the total thickness of the films matched with those designed. As shown in FIGS. 13A and 13B, when the H-cap film was thin (0.5 nm in Example 4), the thickness uniformity was significantly improved as compared with the SiO cap film used in Comparative Example 7. However, when H-cap film was relatively thick (2.0 nm in Example 3), the thickness uniformity was slightly degraded as compared with the SiO cap film used in Comparative Example 6.

After depositing the cap film, the substrate was subjected to annealing to diffuse B/P into the Si substrate under conditions shown in Table 10 below. The resultant films were tested in terms of concentration of B/P diffused into the silicon substrate using Secondary Ion Mass Spectrometry (SIMS), after removing the B/PSG film and the cap film by etching. The results are shown in FIGS. 11 and 12.

TABLE 10

| (the numbers are approximate) Conditions for Annealing | |
|---|---|
| Substrate temperature | 1000° C. |
| Pressure | 101325 Pa |
| Atmosphere | N2 |
| Duration of annealing | 1 sec |

Figure 11:
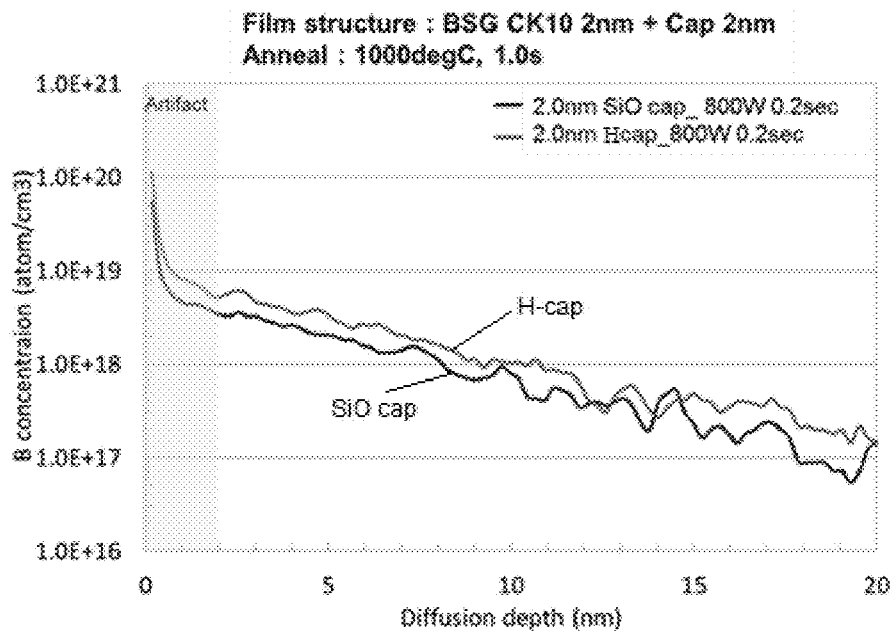
FIG. 11 is a graph showing Boron concentration (atom/$cm^3$) in layers according to an embodiment of the present invention ("H-cap") in relation to that of a comparative example ("SiO cap").

FIG. 11 is a graph showing Boron concentration (atom/$cm^3$) in layers according to Example 3 ("H-cap") in relation to that of Comparative Example 6 ("SiO cap"). As shown in FIG. 11, when the H-cap film was deposited on the BSG film, more boron elements were diffused into the silicon substrate than when the SiO cap film was deposited. Incidentally, the range in gray marked with "Artifact" in FIG. 11 represents a range where the results may not be reliable since the SIMS analysis could not measure the concentration accurately near the surface of the substrate due to unstable reading. FIG. 12 is a graph showing Phosphorus concentration (atom/$cm^3$) in layers according to Example 4 ("H-cap") in relation to that of Comparative Example 7 ("SiO cap"). As shown in FIG. 12, when the H-cap film was deposited on the PSG film, more phosphorus elements were diffused into the silicon substrate than when the SiO cap film was deposited.

Without intent to limit the present invention by the theory, one of the reasons that an H-cap film can increase the concentration of dopant elements into a silicon substrate is the hydrophobic nature of the H-cap film which blocks ambient moisture from reaching or permeating the dopant thin film. When moisture permeates the dopant thin film, dopant elements tend to disperse from the dopant thin film during storage and during an annealing process.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for protecting a layer, comprising:
providing a substrate having a target layer; and
forming a protective layer on the target layer, said protective layer contacting and covering the target layer and containing a hydrocarbon-based layer constituting at least an upper part of the protective layer, said hydrocarbon-based layer being formed by plasma-enhanced atomic layer deposition (PEALD) using solely an alkylaminosilane precursor and a noble gas as process gas.

2. The method according to claim 1, wherein the hydrocarbon-based layer is constituted by a hydrocarbon polymer containing silicon and nitrogen.

3. The method according to claim 1, wherein the target layer is a dopant-doped layer.

4. The method according to claim 3, wherein the doped layer is a doped silicate glass layer.

5. The method according to claim 1, wherein the alkylaminosilane is selected from the group consisting of bisdiethylaminosilane (BDEAS), biszimethylaminosilane (BDMAS), hexylethylaminosilane (HEAD), tetraethylaminosilane (TEAS), tert-butylaminosilane (TBAS), bistert-butylaminosilena (BTBAS), bisdimethylaminodimethylaminosilane (BDMADMS), heptametyhlsilazane (HMDS), trimethysylyldiethlamine (TMSDEA), trimethylsyledimethlamine (TMSDMA), trimethyltoribinylcycletrisilazane (TMTVCTS), tristrimetylhydroxyamine (TTMSHA), bisdimethylsaminomethylsilane (BDMAMS), and dimetyhlsilyldimethlamine (DMSDMA).

6. The method according to claim 1, wherein the protective layer consists essentially of the hydrocarbon-based layer.

7. The method according to claim 6, wherein a thickness of the hydrocarbon-based layer is more than zero but less than about 5 nm.

8. A method for protecting a layer, comprising:
providing a substrate having a target layer; and
forming a protective layer on the target layer, said protective layer contacting and covering the target layer and containing a hydrocarbon-based layer constituting at least an upper part of the protective layer, said hydrocarbon-based layer being formed by plasma-enhanced atomic layer deposition (PEALD) using an alkylaminosilane precursor and a noble gas without a reactant,
wherein the target layer is a non-porous layer.

9. A method for protecting a layer, comprising:
providing a substrate having a target layer; and
forming a protective layer on the target layer, said protective layer contacting and covering the target layer and containing a hydrocarbon-based layer constituting at least an upper part of the protective layer, said hydrocarbon-based layer being formed by plasma-enhanced atomic layer deposition (PEALD) using an alkylaminosilane precursor and a noble gas without a reactant,
wherein the protective layer is comprised of two discrete layers constituted by a primary layer and a secondary layer contacting and covering the primary layer, said secondary layer being the hydrocarbon-based layer, wherein the step of forming the protective layer comprises:
forming a silicon nitride or oxide layer as the primary layer on the target layer; and
continuously forming the hydrocarbon-based layer as the secondary layer on the primary layer.

10. The method according to claim 9, wherein a thickness of the primary layer is about 1 nm to about 10 nm, and a thickness of the secondary layer is more than zero and less than about 1.0 nm.

11. The method according to claim 9, wherein the primary layer is constituted by silicon nitride or non-doped silicate glass.

12. The method according to claim 9, wherein the primary layer is formed by plasma-enhanced cyclic deposition using a precursor, a reactant gas, and a noble gas, wherein the precursor contains silicon and hydrocarbon, and the secondary layer is formed using the precursor and the noble gas without the reactant gas.

13. The method according to claim 12, wherein the secondary layer is formed without using any gas other than those used for forming the primary layer.

14. A method for protecting a layer, comprising:
providing a substrate having a target layer; and
forming a protective layer on the target layer, said protective layer contacting and covering the target layer and containing a hydrocarbon-based layer constituting at least an upper part of the protective layer, said hydrocarbon-based layer being formed by plasma-enhanced atomic layer deposition (PEALD) using an alkylaminosilane precursor and a noble gas without a reactant,
wherein the target layer is a dopant-doped layer,
wherein the doped layer is a doped silicate glass layer,
wherein the doped silicate glass layer is constituted by borosilicate glass or phosphosilicate glass.

15. The method according to claim 1, wherein the step of providing the substrate and the step of forming the protective layer are conducted in the same reaction chamber.

16. The method according to claim 1, further comprising annealing the protective layer.

* * * * *